US012609265B2

(12) United States Patent
Walvoort et al.

(10) Patent No.: US 12,609,265 B2
(45) Date of Patent: Apr. 21, 2026

(54) ACTUATOR ARRANGEMENT AND ELECTRON-OPTICAL COLUMN

(71) Applicant: ASML Netherlands B.V., Veldhoven (NL)

(72) Inventors: Derk Ferdinand Walvoort, Pijnacker (NL); Marc Smits, Pijnacker (NL); Teunis Van De Peut, Leusden (NL)

(73) Assignee: ASML Netherlands B.V., Veldhoven (NL)

( * ) Notice: Subject to any disclaimer, the term of this patent is extended or adjusted under 35 U.S.C. 154(b) by 265 days.

(21) Appl. No.: 18/168,531

(22) Filed: Feb. 13, 2023

(65) Prior Publication Data

US 2023/0207252 A1     Jun. 29, 2023

Related U.S. Application Data

(63) Continuation of application No. PCT/EP2021/071804, filed on Aug. 4, 2021.

(30) Foreign Application Priority Data

Aug. 14, 2020    (EP) ..................................... 20191131

(51) Int. Cl.
        *H01J 37/15*          (2006.01)
        *H01J 37/28*          (2006.01)
(52) U.S. Cl.
        CPC ............... *H01J 37/15* (2013.01); *H01J 37/28* (2013.01)
(58) Field of Classification Search
        CPC ................................... H01J 37/15; H01J 37/28
        See application file for complete search history.

(56) References Cited

U.S. PATENT DOCUMENTS

| | | | |
|---|---|---|---|
| 5,979,187 A | 11/1999 | Churchley et al. | |
| 2013/0048854 A1* | 2/2013 | Sakamoto ............... | H01J 37/20 250/310 |
| 2020/0002663 A1 | 1/2020 | Doebler et al. | |

FOREIGN PATENT DOCUMENTS

| | | |
|---|---|---|
| CN | 106663579 B | 8/2018 |
| JP | H11-329319 A | 11/1999 |
| TW | I430325 B | 3/2014 |
| TW | I679367 B | 12/2019 |
| WO | WO 2011/034020 A1 | 3/2011 |

OTHER PUBLICATIONS

International Search Report issued in related Foreign Application No. PCT/EP2021/071804; mailed Nov. 19, 2021 (2 pgs.).

* cited by examiner

*Primary Examiner* — Nicole M Ippolito
(74) *Attorney, Agent, or Firm* — FINNEGAN, HENDERSON, FARABOW, GARRETT & DUNNER, LLP

(57)                              ABSTRACT

Disclosed herein is an actuator arrangement comprising: a wall defining a cavity; a casing protruding from the wall and defining an interior in fluid communication with the cavity; an actuator comprising: a force imparter configured to impart force on a component in the cavity; and an actuation mechanism configured to drive the force imparter, wherein at least part of the actuation mechanism is within said interior of the casing and exposed to the cavity; and a control element configured to control the actuation mechanism, wherein the control element extends through the casing via a seal.

20 Claims, 10 Drawing Sheets

ACTUATOR ARRANGEMENT AND ELECTRON-OPTICAL COLUMN

CROSS-REFERENCE TO RELATED APPLICATIONS

This application claims priority of International application PCT/EP2021/071804, which was filed on 4 Aug. 2021, which claims priority of EP application 20191131.0, which was filed on 14 Aug. 2020, all of which are incorporated herein by reference in their entireties.

FIELD

The embodiments provided herein generally relate the provision of an actuator arrangement and an electron-optical column, for example for use in a charged particle apparatus. Embodiments also provide a method of manufacturing an actuator arrangement, a method of replacing an actuation mechanism and a method of manufacturing an electron-optical column.

BACKGROUND

When manufacturing semiconductor integrated circuit (IC) chips, undesired pattern defects, as a consequence of, for example, optical effects and incidental particles, inevitably occur on a substrate (i.e. wafer) or a mask during the fabrication processes, thereby reducing the yield. Monitoring the extent of the undesired pattern defects is therefore an important process in the manufacture of IC chips. More generally, the inspection and/or measurement of a surface of a substrate, or other object/material, is an import process during and/or after its manufacture.

Pattern inspection tools with a charged particle beam have been used to inspect objects, for example to detect pattern defects. These tools typically use electron microscopy techniques, such as a scanning electron microscope (SEM). In a SEM, a primary electron beam of electrons at a relatively high energy is targeted with a final deceleration step in order to land on a sample at a relatively low landing energy. The beam of electrons is focused as a probing spot on the sample. The interactions between the material structure at the probing spot and the landing electrons from the beam of electrons cause electrons to be emitted from the surface, such as secondary electrons, backscattered electrons or Auger electrons. The generated secondary electrons may be emitted from the material structure of the sample. By scanning the primary electron beam as the probing spot over the sample surface, secondary electrons can be emitted across the surface of the sample. By collecting these emitted secondary electrons from the sample surface, a pattern inspection tool may obtain an image representing characteristics of the material structure of the surface of the sample.

Another application for a charged particle beam is lithography. The charged particle beam reacts with a resist layer on the surface of a substrate. A desired pattern in the resist can be created by controlling the locations on the resist layer that the charged particle beam is directed towards.

A charged particle apparatus may be an apparatus for generating, illuminating, projecting and/or detecting one or more beams of charged particles. Within a charged particle apparatus, one or more electron-optical devices are provided for manipulating one or more beams of charged particles. One or more electron-optical devices require actuation. For example, an electron-optical device may be required to be moved so as to align with the beam of charged particles. Space within the electron-optical column is limited.

There is a general need to improve on known techniques for providing an actuator arrangement particularly for an electron-optical column having limited space. There is also a general need to improve on known techniques for allowing the electron-optical column to be vented or pumped.

SUMMARY

According to some embodiments of the present disclosure, there is provided an actuator arrangement comprising: a wall defining a cavity; a casing protruding from the wall and defining an interior in fluid communication with the cavity; an actuator comprising: a force imparter configured to impart force on a component in the cavity; and an actuation mechanism configured to drive the force imparter, wherein at least part of the actuation mechanism is within said interior of the casing and exposed to the cavity; and a control element configured to control the actuation mechanism, wherein the control element extends through the casing via a seal.

According to some embodiments of the present disclosure, there is provided an electron-optical column configured to be held at vacuum comprising: an electron-optical element; a vacuum chamber configured to contain the vacuum around the electron-optical element and defined by a wall; and a conduit opening defined in the wall configured to provide fluid connection to a vacuum source, wherein a position of the conduit opening in an axial direction of the electron-optical column at least partially overlaps a position of the electron-optical element in the axial direction, and wherein the electron-optical element is arranged so as to only partially occlude the conduit opening such that an area sufficient for the vacuum source to be applied throughout the vacuum chamber is open to the vacuum source.

According to some embodiments of the present disclosure, there is provided a replaceable electron-optical assembly configured for use in a vacuum chamber of an electron-optical column, the removeable electron-optical assembly comprising an electron-optical element configured to manipulate a path of a beam of charged particles through the electron-optical column, wherein in a surface of the removeable electron-optical assembly is defined a feature configured to distribute an under pressure through the vacuum chamber.

According to some embodiments of the present disclosure, there is provided a method of manufacturing an actuator arrangement, the method comprising: providing a wall defining a cavity; providing an actuator comprising: a force imparter configured to impart force on a component in the cavity; and an actuation mechanism configured to drive the force imparter; extending a control element configured to control the actuation mechanism through the casing via a seal; disposing the actuation mechanism within an interior of a casing; connecting the actuation mechanism to the control element; and sealing the casing to the wall such that the casing protrudes from the wall and the actuation mechanism is exposed to the cavity.

According to some embodiments of the present disclosure, there is provided a method of replacing an actuation mechanism of an actuator arrangement, the method comprising: providing the actuator arrangement; releasing the seal between the wall and the casing; replacing the actuation mechanism; and sealing the casing to the wall.

According to some embodiments of the present disclosure, there is provided a method of manufacturing an electron-optical column configured to be held at vacuum comprising: an electron-optical element; a vacuum chamber configured to contain the vacuum around the electron-optical element and defined by a wall; and a conduit opening defined in the wall configured to provide fluid connection to a vacuum source, wherein a position of the conduit opening in an axial direction of the electron-optical column at least partially overlaps a position of the electron-optical element in the axial direction, and wherein the electron-optical element is arranged so as to only partially occlude the conduit opening such that an area sufficient for the vacuum source to be applied throughout the vacuum chamber is open to the vacuum source.

Advantages of the technology provided in the present disclosure will become apparent from the following description taken in conjunction with the accompanying drawings wherein are set forth, by way of illustration and example, certain examples.

BRIEF DESCRIPTION OF FIGURES

The above and other aspects of the present disclosure will become more apparent from the description of exemplary embodiments, taken in conjunction with the accompanying drawings.

FIG. 1 is a schematic diagram illustrating an exemplary charged particle beam inspection apparatus.

Figure 2:
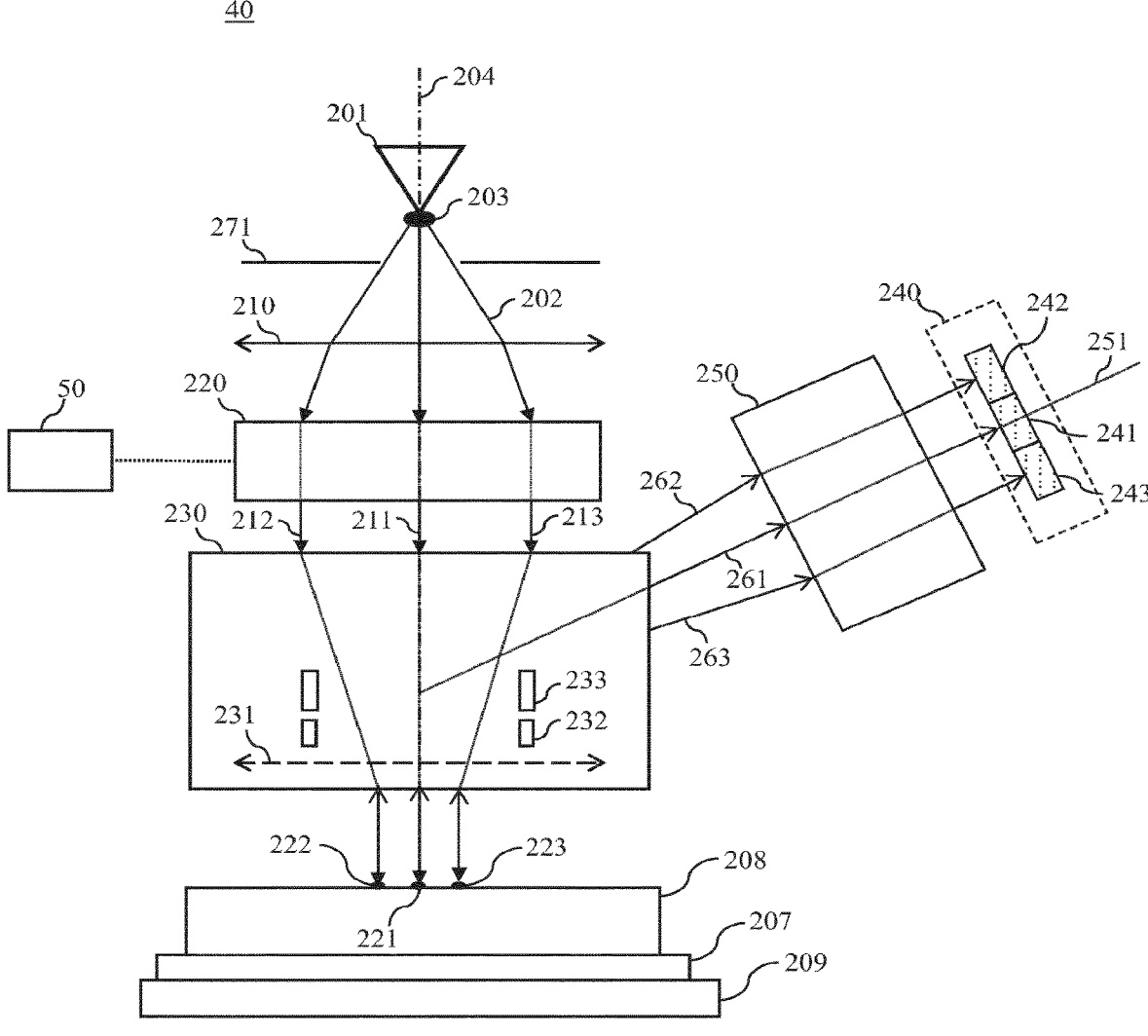
FIG. 2 is a schematic diagram illustrating an exemplary multi-beam apparatus that is part of the exemplary charged particle beam inspection apparatus of FIG. 1.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations. Instead, they are merely examples of apparatuses and methods consistent with aspects related to the invention as recited in the appended claims.

DETAILED DESCRIPTION

An error in any step of the process of manufacturing an IC chip has the potential to adversely affect the functioning of the final product. It is desirable to improve the overall yield of the process. For example, to obtain a 75% yield for a 50-step process (where a step may indicate the number of layers formed on a wafer), each individual step must have a yield greater than 99.4%. If an individual step has a yield of 95%, the overall process yield would be as low as 7-8%.

Maintaining a high substrate (i.e. wafer) throughput, defined as the number of substrates processed per hour, is also desirable. High process yield and high substrate throughput may be impacted by the presence of a defect. This is especially if operator intervention is required for reviewing the defects. High throughput detection and identification of micro and nano-scale defects by inspection tools (such as a Scanning Electron Microscope (SEW)) is desirable for maintaining high yield and low cost for IC chips.

A SEM comprises a scanning device and a detector apparatus. The scanning device comprises an illumination apparatus that comprises an electron source, for generating primary electrons, and a projection apparatus for scanning a sample, such as a substrate, with one or more focused beams of primary electrons. The primary electrons interact with the sample and generate interaction products, such as secondary electrons and/or backscattered electrons. The detection apparatus captures the secondary electrons and/or backscattered electrons from the sample as the sample is scanned so that the SEM may create an image of the scanned area of the sample. For high throughput inspection, some of the inspection apparatuses use multiple focused beams, i.e. a multi-beam, of primary electrons. The component beams of the multi-beam may be referred to as sub-beams or beamlets. A multi-beam may scan different parts of a sample simultaneously. A multi-beam inspection apparatus may therefore inspect a sample at a much higher speed than a single-beam inspection apparatus.

In a multi-beam inspection apparatus, the paths of some of the primary electron beams are displaced away from the central axis, i.e. a mid-point of the primary electron-optical axis (also referred to herein as the charged particle axis), of the scanning device. An implementation of a known multi-beam inspection apparatus is described below.

The Figures are schematic. Relative dimensions of components in drawings are therefore exaggerated for clarity. Within the following description of drawings the same or like reference numbers refer to the same or like components or entities, and only the differences with respect to the individual embodiments are described. While the description and drawings are directed to an electron-optical apparatus, it is appreciated that the embodiments are not used to limit the present disclosure to specific charged particles. References to electrons throughout the present document may therefore be more generally be considered to be references to charged particles, with the charged particles not necessarily being electrons.

Figure 1:
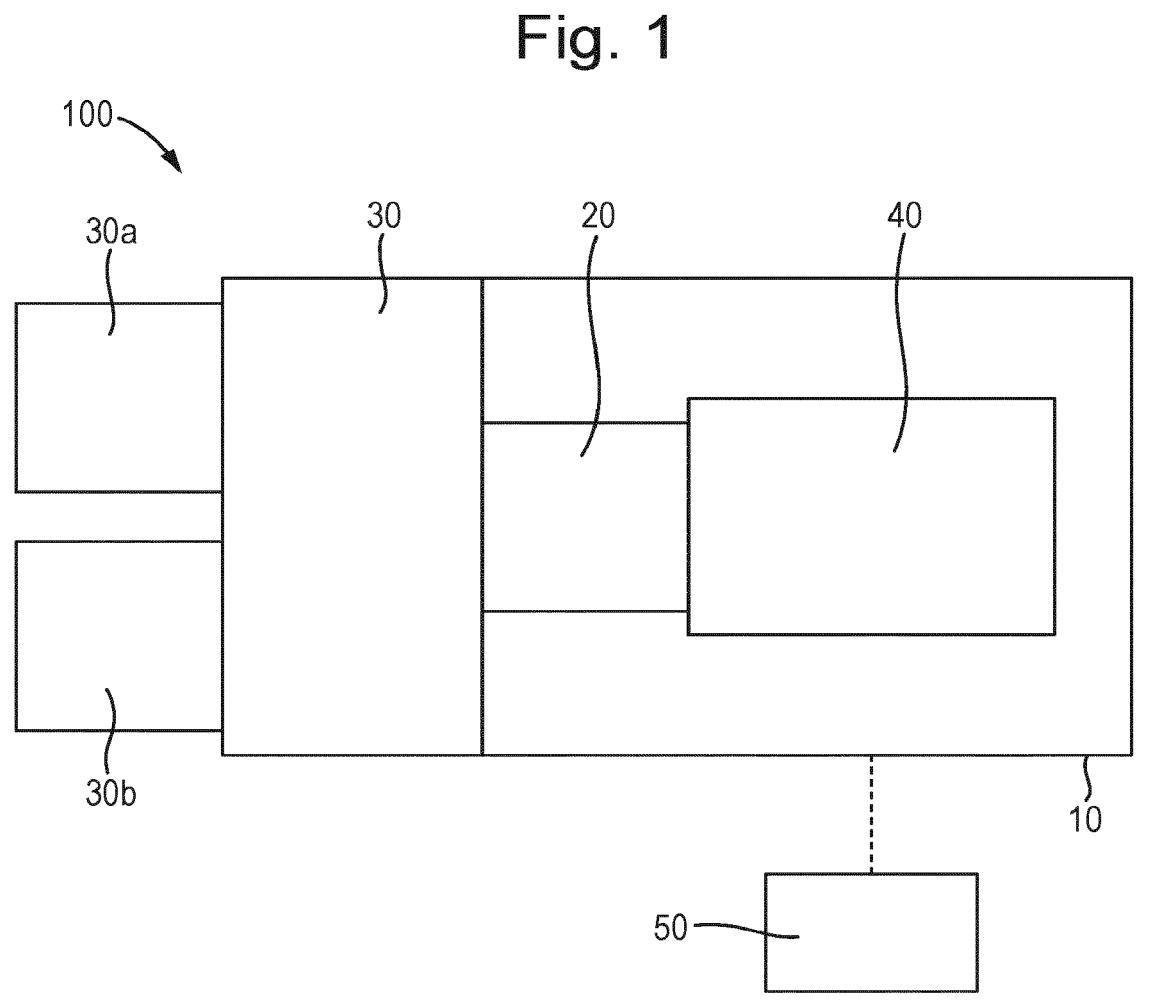

Reference is now made to FIG. 1, which is a schematic diagram illustrating an exemplary charged particle beam inspection apparatus 100. The charged particle beam inspection apparatus 100 of FIG. 1 includes a vacuum chamber 10, a load lock chamber 20, an electron beam tool 40, an equipment front end module (EFEM) 30 and a controller 50.

The EFEM 30 includes a first loading port 30a and a second loading port 30b. The EFEM 30 may include additional loading port(s). The first loading port 30a and second loading port 30b may, for example, receive substrate front opening unified pods (FOUPs) that contain substrates (e.g., semiconductor substrates or substrates made of other material(s)) or samples to be inspected (substrates, wafers and samples are collectively referred to as "samples" hereafter). One or more robot arms (not shown) in EFEM 30 transport the samples to load lock chamber 20.

The load lock chamber 20 is used to remove the gas around a sample. The load lock chamber 20 may be connected to a load lock vacuum pump system (not shown), which removes gas particles in the load lock chamber 20. The operation of the load lock vacuum pump system enables the load lock chamber to reach a first pressure below the atmospheric pressure. The main chamber 10 is connected to a main chamber vacuum pump system (not shown). The main chamber vacuum pump system removes gas molecules in the main chamber 10 so that the pressure around the sample reaches a second pressure lower than the first pressure. After reaching the second pressure, the sample is transported to the electron beam tool by which it may be inspected. An electron beam tool 40 may comprise either a single beam or a multi-beam electron-optical apparatus.

The controller 50 is electronically connected to the electron beam tool 40. While the controller 50 is shown in FIG. 1 as being outside of the structure that includes the main chamber 10, the load lock chamber 20, and the EFEM 30, it is appreciated that the controller 50 may be part of the structure.

Reference is now made to FIG. 2, which is a schematic diagram illustrating an exemplary electron beam tool 40 which is a multi-beam inspection tool that is part of the exemplary charged particle beam inspection apparatus 100 of FIG. 1. The multi-beam electron beam tool 40 comprises an electron source 201, a gun aperture plate 271, a condenser lens 210, a source conversion unit 220, a primary projection apparatus 230, a motorized stage 209, and a sample holder 207. The electron source 201, the gun aperture plate 271, the condenser lens 210, the source conversion unit 220 are the components of an illumination apparatus comprised by the electron beam tool 40. The sample holder 207 is supported by motorized stage 209 so as to hold a sample 208 (e.g., a substrate or a mask) for inspection. The multi-beam electron beam tool 40 may further comprise a secondary projection apparatus 250 and an associated electron detection device 240. The primary projection apparatus 230 may comprise an objective lens 231. A beam separator 233 and a deflection scanning unit 232 may be positioned inside primary projection apparatus 230. The electron detection device 240 may comprise a plurality of detection elements 241, 242, and 243.

The components that are used to generate a primary beam may be aligned with a primary electron-optical axis 204 of the electron beam tool 40. These components may include: the electron source 201, gun aperture plate 271, condenser lens 210, source conversion unit 220, beam separator 233, deflection scanning unit 232, and primary projection apparatus 230. The secondary projection apparatus 250 and its associated electron detection device 240 may be aligned with a secondary electron-optical axis 251 of the electron beam tool 40.

During operation, the electron source 201 is configured to emit electrons as primary electrons. The primary electrons are extracted or accelerated by the extractor and/or the anode to form a primary electron beam 202 that forms a primary beam crossover (virtual or real) 203.

The gun aperture plate 271, in operation, is configured to block off peripheral electrons of primary electron beam 202 to reduce the Coulomb effect. The gun aperture plate 271 may be referred to as a Coulomb Aperture Array. The Coulomb effect may enlarge the size of each of probe spots 221, 222, and 223 of primary sub-beams 211, 212, 213, and therefore deteriorate inspection resolution. A gun aperture plate 271 may also include multiple openings for generating primary sub-beams (not shown) even before the source conversion unit 220 and may be referred to as a coulomb aperture array.

The condenser lens 210 is configured to focus (or collimate) primary electron beam 202. In some embodiments, the source conversion unit 220 may comprise an image-forming element array, an aberration compensator array, a beam-limit aperture array, and a pre-bending micro-deflector array. The pre-bending micro-deflector array may, for example, be optional and may be present in which the condenser lens does not ensure substantially normal incidence of sub-beams originating from the coulomb aperture array onto e.g. the beam-limit aperture array, the image-forming element array, and/or the aberration compensator array. The image-forming element array may be configured to generate the plurality of sub-beams in the multi-beam path, i.e. primary sub-beams 211, 212, 213. The image forming element array may, for example, comprise a plurality electron beam manipulators such as micro-deflectors micro-lenses (or a combination of both) to influence the plurality of primary sub-beams 211, 212, 213 of primary electron beam 202 and to form a plurality of parallel images (virtual or real) of primary beam crossover 203, one for each of the primary sub-beams 211, 212, and 213. The aberration compensator array may, for example, comprise a field curvature compensator array (not shown) and an astigmatism compensator array (not shown). The field curvature compensator array may, for example, comprise a plurality of micro-lenses to compensate field curvature aberrations of the primary sub-beams 211, 212, and 213. The astigmatism compensator array may comprise a plurality of micro-stigmators to compensate astigmatism aberrations of the primary sub-beams 211, 212, and 213. The beam-limit aperture array may be configured to define the diameters of individual primary sub-beams 211, 212, and 213. The controller 50 may be connected to various parts of charged particle beam inspection apparatus 100 of FIG. 1, such as the source conversion unit 220, the electron detection device 240, the primary projection apparatus 230, or the motorized stage 209. The controller 50 may perform various image and signal processing functions.

The objective lens 231 may be configured to focus sub-beams 211, 212, and 213 onto the sample 208 for inspection and, in the current example, may form three probe spots 221, 222, and 223 on the surface of sample 208. The beam separator 233 may be, for example, a Wien filter comprising an electrostatic dipole field and a magnetic dipole field (not shown in FIG. 2). The deflection scanning unit 232, in operation, is configured to deflect primary sub-beams 211, 212, and 213 to scan probe spots 221, 222, and 223 across individual scanning areas in a section of the surface of sample 208. In response to incidence of primary sub-beams 211, 212, and 213 or probe spots 221, 222, and 223 on sample 208, electrons are generated from the sample 208 which include secondary electrons and backscattered electrons. In the current example, the secondary electrons propagate in three secondary electron beams 261, 262, and 263. The secondary projection apparatus 250 subsequently focuses the path of secondary electron beams 261, 262, and 263 onto a plurality of detection regions 241, 242, and 243 of electron detection device 240.

The detection elements 241, 242, and 243 may detect the corresponding secondary electron beams 261, 262, and 263. On incidence of secondary electron beams with the detection elements 241, 242 and 243, the elements may generate corresponding intensity signal outputs (not shown). The outputs may be directed to an image processing system (e.g., the controller 50).

Although FIG. 2 shows that the electron beam tool 40 uses three primary electron sub-beams, it is appreciated that the electron beam tool 40 may use two or more number of primary electron sub-beams. The present disclosure does not limit the number of primary electron beams used in the electron beam tool 40.

Figure 3:
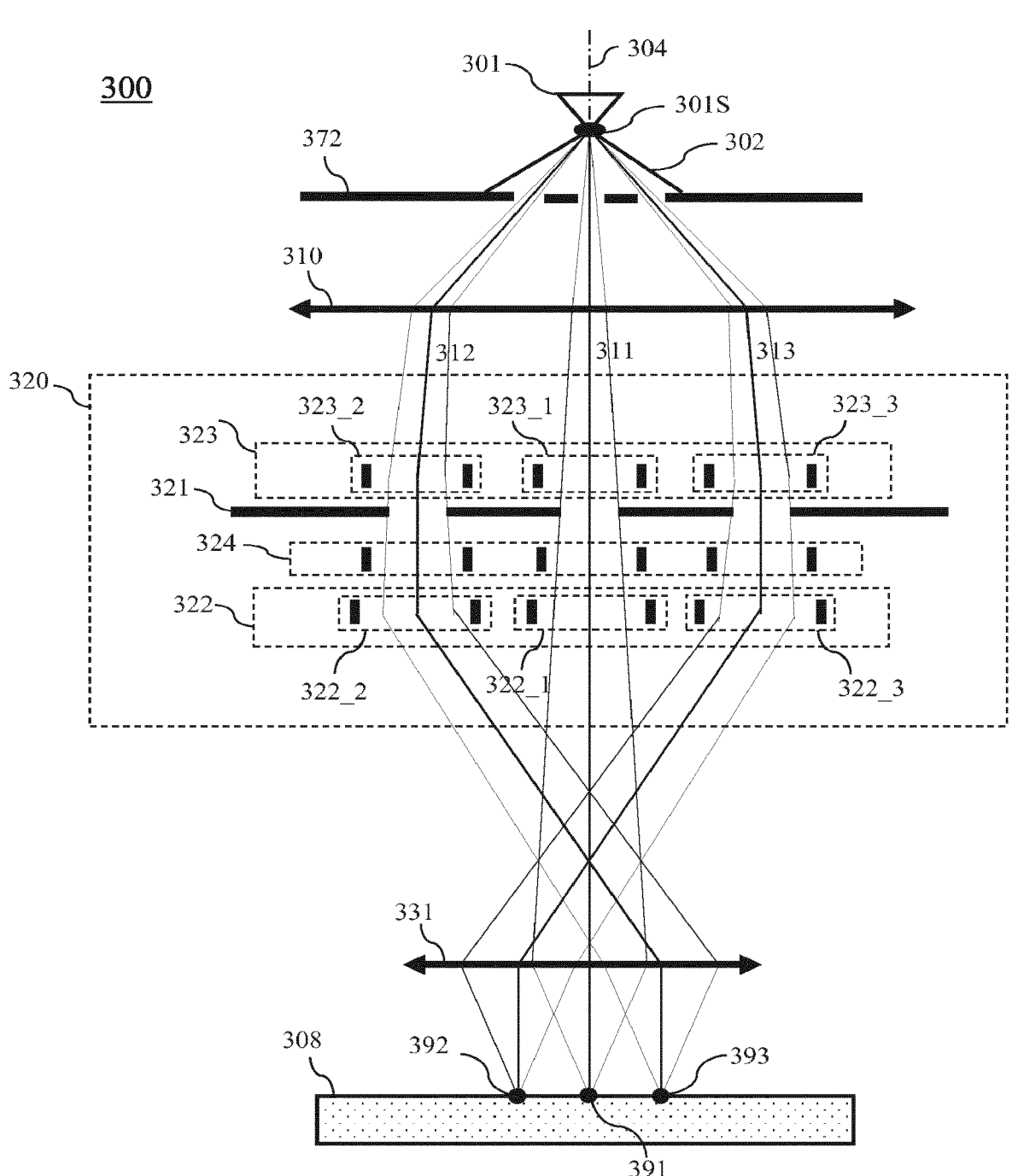
FIG. 3 is a schematic diagram of exemplary multi-beam apparatus illustrating an exemplary configuration of source conversion unit of the exemplary charged particle beam inspection apparatus of FIG. 1.

Reference is now made to FIG. 3, which is a schematic diagram of an exemplary multi-beam electron beam tool 300 illustrating an exemplary configuration of the source conversion unit of the exemplary charged particle beam inspection apparatus 100 of FIG. 1. The electron beam tool 300 may comprise an election source 301, a pre-sub-beam-forming aperture array 372 (further also referred to as coulomb aperture array 372), a condenser lens 310 (similar to the condenser lens 210 of FIG. 2), a source conversion unit 320, an objective lens 331 (similar to the objective lens 231 of FIG. 2), and a sample 308 (similar to the sample 208 of FIG. 2). The electron source 301, the coulomb aperture array 372, the condenser lens 310 may be the components of an illumination apparatus comprised by the electron beam tool 300. The source conversion unit 320 and the objective lens 331 may be the components of a projection apparatus comprised by the electron beam tool 300. The source conversion unit 320 may be similar to source conversion unit 220 of FIG. 2. The election source 301, the coulomb aperture array 372, the condenser lens 310, the source conversion unit 320, and the objective lens 331 are aligned with a primary electron-optical axis 304 of the apparatus. The electron source 301 generates a primary-electron beam 302 generally along the primary electron-optical axis 304 and with a source crossover (virtual or real) 301S. The coulomb aperture array 372 cuts the peripheral electrons of primary electron beam 302 to reduce a consequential Coulomb effect. The primary-electron beam 302 may be trimmed into a specified number of sub-beams, such as three sub-beams 311, 312 and 313, by the coulomb aperture array 372 of a pre-sub-beam-forming mechanism. Although three sub-beams and their paths are referred to in the previous and following description, it should be understood that the description is intended to apply an apparatus, tool, or system with any number of sub-beams.

The source conversion unit 320 may include a beamlet-limit aperture array 321 with beam-limit apertures configured to define the outer dimensions of the sub-beams 311, 312, and 313 of the primary electron beam 302. The source conversion unit 320 may also include an image-forming element array 322 with image-forming micro-deflectors, 322_1, 3222, and 322_3. There is a respective micro-deflector associated with the path of each sub-beam. The micro-deflectors 322_1, 3222, and 322_3 are configured to deflect the paths of the sub-beams 311, 312, and 313 towards the electron-optical axis 304. The deflected sub-beams 311, 312 and 313 form virtual images (not shown) of source crossover 301S. In the current example, these virtual images are projected onto the sample 308 by the objective lens 331 and form probe spots thereon, which are the three probe spots, 391, 392, and 393. The source conversion unit 320 may further comprise an aberration compensator array 324 configured to compensate aberrations that may be present in each of the sub-beams.

In the current example of the source conversion unit 320, the sub-beams 311, 312 and 313 of the primary electron beam 302 are respectively deflected by the micro-deflectors 322_1, 322_2 and 322_3 of image-forming element array 322 towards the primary electron-optical axis 304. It should be understood that the sub-beam 311 path may already correspond to the electron-optical axis 304 prior to reaching micro-deflector 322_1, accordingly the sub-beam 311 path may not be deflected by micro-deflector 322_1.

The objective lens 331 focuses the sub-beams onto the surface of the sample 308, i.e., it projects the three virtual images onto the sample surface. The three images formed by three sub-beams 311 to 313 on the sample surface form three probe spots 391, 392 and 393 thereon. In some embodiments, the deflection angles of sub-beams 311 to 313 are adjusted to pass through or approach the front focal point of objective lens 331 to reduce or limit the off-axis aberrations of three probe spots 391 to 393.

The aberration compensator array 324 may, for example, include a field curvature compensator array (not shown) with micro-lenses. The field curvature compensator and micro-lenses may, for example, be configured to compensate the individual sub-beams for field curvature aberrations evident in the probe spots, 391, 392, and 393. The aberration compensator array 324 may include an astigmatism compensator array (not shown) with micro-stigmators. The micro-stigmators may, for example, be controlled to operate on the sub-beams to compensate astigmatism aberrations that are otherwise present in the probe spots, 391, 392, and 393.

The source conversion unit 320 may further comprise a pre-bending micro-deflector array 323 with pre-bending micro-deflectors 323_1, 3232, and 323_3 to bend the sub-beams 311, 312, and 313 respectively. The pre-bending micro-deflectors 323_1, 3232, and 323_3 may bend the path of the sub-beams onto the beamlet-limit aperture array 321. In some embodiments, the pre-bending micro-deflector array 323 may be configured to bend the sub-beam path of sub-beams towards the orthogonal of the plane of on beam-let-limit aperture array 321. In some embodiments, the condenser lens 310 may adjust the path direction of the sub-beams onto the beamlet-limit aperture array 321. The condenser lens 310 may, for example, focus (collimate) the three sub-beams 311, 312, and 313 to become substantially parallel beams along primary electron-optical axis 304, so that the three sub-beams 311, 312, and 313 incident substantially perpendicularly onto source conversion unit 320, which may correspond to the beamlet-limit aperture array 321. In some embodiments, the pre-bending micro-deflector array 323 may not be necessary.

The image-forming element array 322, the aberration compensator array 324, and the pre-bending micro-deflector array 323 may comprise multiple layers of sub-beam manipulating devices, some of which may be in the form or arrays, for example: micro-deflectors, micro-lenses, or micro-stigmators.

At least some of the above-described components in FIG. 2 and FIG. 3 may individually, or in combination with each other, be referred to as a manipulator array, or manipulator, because they manipulate one or more beams, or sub-beams, of charged particles.

The above described embodiments of multi-beam inspection tools comprise a multi-beam charged particle apparatus, which may be referred to as a multi-beam charged particle optical apparatus, with a single source of charged particles. The multi-beam charged particle apparatus comprises an illumination apparatus and a projection apparatus. The illumination apparatus may generate a multi-beam of charged particles from the beam of electrons from the source. The projection apparatus projects a multi-beam of charged particles towards a sample. At least part of the surface of a sample may be scanned with the multi-beam of charged particles.

A multi-beam charged particle apparatus comprises one or more electron-optical devices for manipulating the sub-beams of the multi-beam of charged particles. The applied manipulation may be, for example, a deflection of the paths of sub-beams and/or a focusing operation applied to the sub-beams. The one or more electron-optical devices may comprise one or more microelectromechanical systems (MEMS). MEMS are miniaturized mechanical and electro-mechanical elements that are made using microfabrication techniques. In some embodiments, the source conversion unit 320 comprises electron-optical manipulator devices such as apertures, microlenses and deflectors which may be formed as MEMS. In some embodiments, the manipulators such as the microlenses and deflectors are controllable so as to control, or operate on, the sub-beams of charged particles projected towards the sample.

Figure 4:
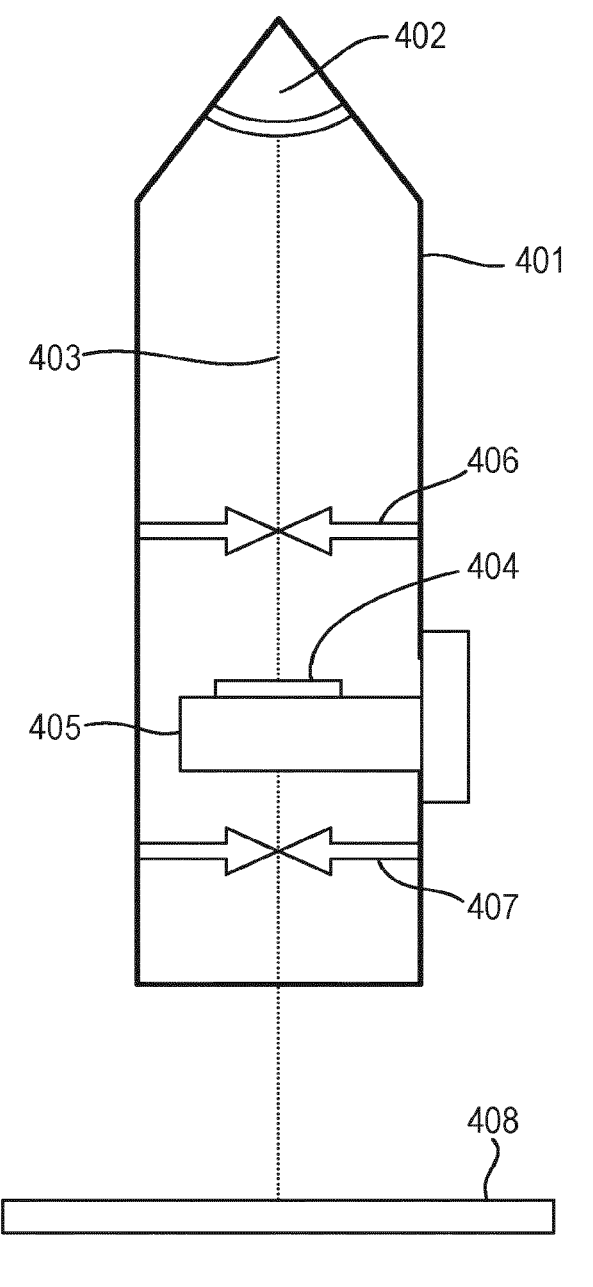
FIG. 4 is a schematic diagram of part of an electron-optical column according to some embodiments of the present disclosure.
Figure 4:
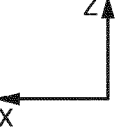

The electron beam tool 40, 300 comprises an electron-optical column 401. The electron-optical column comprises at least some of the elements that form the sub-beams of the multi-beam that are projected towards the sample. The electron-optical column 401 comprises a vacuum chamber that houses the elements. FIG. 4 is a schematic diagram of an electron-optical column 401 according to some embodiments.

The electron-optical column 401 comprises a source 402. The source 402 emits a charged particle beam, referred to herein as a source beam. Similar to the earlier described optical axis 204 and 304, within the electron-optical column 401 there is a charged particle axis. A charged particle beam path 403, referred to herein as a charged particle path 403, that may be a multi-beam path, may be substantially along the charged particle axis.

An electron-optical device 404 is provided in the charged particle path 403. In some embodiments, the electron-optical device 404 comprises electron-optical elements such as apertures, microlenses and deflectors that manipulate the multi-beam. The electron-optical device 404 may be supported in the charged particle path 403 by an electron-optical assembly 405. In some embodiments, the electron-optical assembly 405 has a stage on which the electron optical device 404 may be supported. In some embodiments, the electron-optical assembly 405 is a module. In some embodiments, the electron-optical assembly 405 is replaceable. In some embodiments, the electron-optical assembly 405 is field replaceable. This means that the electron-optical assembly 405 can be quickly and easily removed from the electron-optical column 401 and replaced for example while the tool is in-situ. There is an opening in the wall of the electron-optical column 401 so that the electron-optical assembly 405, and thereby an electron-optical device 404 supported by the electron-optical assembly 405, are replaceable components of the electron-optical column 401. The electron-optical column 401 comprises an up-beam vacuum lock 406. The up-beam vacuum lock 406 is closer to the source 402 than the electron-optical assembly 405. The electron-optical column 401 also comprises a down-beam vacuum lock 407. The down-beam vacuum lock 407 is further from the source 402 than the electron-optical assembly 405. In operation, sample/substrate 408 is irradiated by a beam, or multi-beam, of charged particles emitted from the electron-optical column 401.

Embodiments include a number of techniques for ensuring that the electron-optical device 404 is appropriately aligned with the charged particle path 403. Appropriate alignment may require position adjustments of the electron-optical device 404 and/or the charged particle path 403 in a number of degrees of freedom. In particular, the charged particle path 403 may define a z-direction. In a plane that is orthogonal to the charged particle path 403, orthogonal x-directions and y-directions may be defined. Up to six degrees of freedom may be defined as linear position adjustments in the x-direction, y-direction and z-direction, as well as rotational position adjustments about an x-axis (i.e. Rx), a y-axis (i.e. Ry) and a z-axis (i.e. Rz). It may be worth noting that some of the devices which may be mounted to a field replaceable module may be planar or have a planar structure. In operation, the structure may be alignable with the plane orthogonal to the beam path; thus the planar structure may be in the x axis and the y axis and be rotatable around Rz.

In some embodiments, the electron-optical column 401 may comprise alternative and/or additional components on the charged particle path, such as lenses and other components some of which have been described earlier with reference to FIGS. 1 to 3. In particular, embodiments include an electron-optical column 401 that divides a charged particle beam from a source into a plurality of sub-beams. A plurality of respective objective lenses may project the sub-beams onto a sample. In some embodiments, a plurality of condenser lenses is provided up-beam from the objective lenses. The condenser lenses focus each of the sub-beams to an intermediate focus up-beam of the objective lenses. In some embodiments, collimators are provided up-beam from the objective lenses. Correctors may be provided to reduce focus error and/or aberrations. In some embodiments, such correctors are integrated into or positioned directly adjacent to the objective lenses. Where condenser lenses are provided, such correctors may additionally, or alternatively, be integrated into, or positioned directly adjacent to, the condenser lenses and/or positioned in, or directly adjacent to, the intermediate foci. A detector is provided to detect charged particles emitted by the sample. The detector may be integrated into the objective lens. The detector may be on the bottom surface of the objective lens so as to face a sample in use. The condenser lenses, objective lenses and/or detector may be formed as MEMS or CMOS devices.

In some embodiments, one or more electron-optical components of the electron-optical column 401 may be replaceable. For example, in some embodiments, the array of condenser lenses is replaceable. Additionally or alternatively, in some embodiments, the array of objective lenses is replaceable. Additionally or alternatively, in some embodiments, other components of the electron-optical column 401 are replaceable.

As shown in FIG. 4, the up-beam vacuum lock 406 and the down-beam vacuum lock 407 allow a vacuum chamber in the electron-optical column 401 to be isolated from the vacuum conditions in the rest of the electron-optical column 401. The electron-optical assembly 405 may be replaceable.

The process of replacing an electron-optical assembly 405 may comprise the following steps. The power supply to the source may be cut off so that no charged particles are emitted. The up-beam vacuum lock 406 and the down-beam vacuum lock 407 may be closed so that the region of the electron-optical column 401 that comprises the electron-optical assembly 405 may be isolated from the vacuum conditions in the rest of the electron-optical column 401. The region of the electron-optical column 401 that comprises the electron-optical assembly 405 may then be vented and the electron-optical assembly 405 removed from the electron-optical column 401. A new electron-optical assembly 405 may be installed in its place; alternatively the electron-optical assembly 405 may be replaced in the electron-optical column 401. A pumping process may be performed to return the region of the electron-optical column 401 that comprises the electron-optical assembly 405 to vacuum conditions and a baking process may also be performed. Both the up-beam vacuum lock 406 and down-beam vacuum lock 407 may then be opened. The power supply to the source may be switched on so that charged particles are emitted.

In some embodiments, the electron-optical assembly 405 is a module. In some embodiments, it may be a stage to support which the electron optical device 404 for example, if a module is absent. References in the description to the electron-optical assembly 405 may be applied to the features where a stage is present, for example without other features of the module enabling replaceability or field replaceability. In some embodiments, the electron-optical assembly 405 is a different part of the electron-optical column 401. The different part of the electron-optical column 401 may be, in a non-limited list, an electron-optical component such as a condenser lens arrangement, an objective lens assembly, a Wien filter arrangement, a detector or an element of a secondary column for an electron detector.

Figures 5, 6:
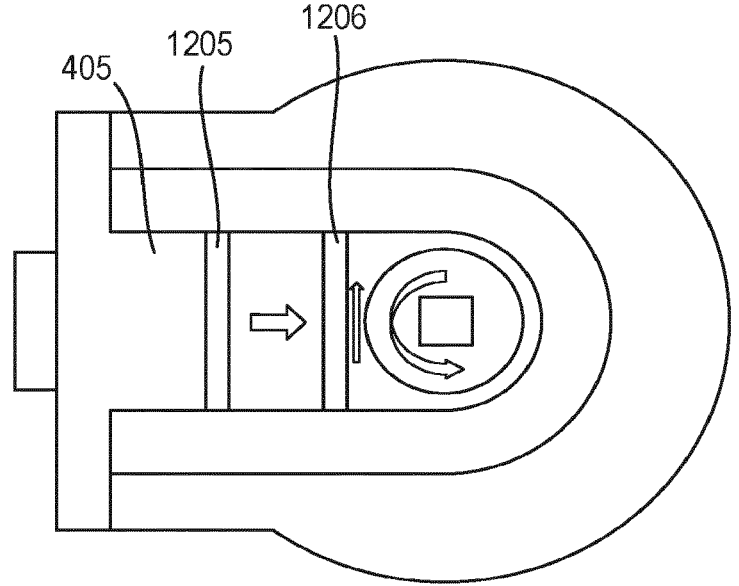
FIG. 5 is a schematic diagram of a cross section through part of a module according to some embodiments of the present disclosure.
FIG. 6 is a schematic diagram of a cross section through part of a module according to some embodiments of the present disclosure.

FIG. 5 shows a schematic diagram of a cross sectional view through the electron-optical assembly 405. The wall 504 defines the cavity that the electron-optical assembly 405 is required to fit into. The wall 504 is a wall of the vacuum chamber of the electron-optical column 401. The cross-section is in a plane that is orthogonal to the charged particle path 403 and shows some further details of the support positioning system 801 of the electron-optical assembly 405. The support positioning system 801 is configured to position the electron-optical device 404 configured to manipulate a beam of electrons.

The support positioning system 801 comprises a disc. The disc may be annular and comprise a central opening 806 for the charged particle path 403. The disc may be supported in the electron-optical assembly 405 by a plurality of ball bearings 803, 804. There may be one or more ball bearings 804 in contact with the up-beam surface of the disc. The ball bearings 803 in contact with the down-beam surface may each be in contact with the base 805 of the electron-optical assembly 405.

A plurality of actuators 901, 902, 903 are provided for moving the disc in the plane of the electron-optical assembly 405. Each actuator 901, 902, 903 may comprise a force imparter such as an actuator arm. Each actuator arm may be part of an actuator 901, 902, 903. Alternatively, each actuator arm may be a separate component to each actuator 901, 902, 903 with each actuator arm connected to an actuator 901, 902, 903. There may be a roller bearing at the end of each actor arm or some other means to allow the actuator to move along the disc of the support positioning system 801 while causing relatively low friction. Each actuator 901, 902, 903 may, for example, be a linear actuator having a longitudinal axis so that the actuator arm is configured to move along its longitudinal axis. Some or all of the actuators 901, 902, 903 may, for example, be automatically operated. Alternatively, some or all of the actuators 901, 902, 903 may be motorized, pneumatically controlled or otherwise moveable so that the actuator arms may be automatically moved. The disc of the support positioning system 801 in the current example comprises a plurality of receiving parts 906, 907, 908 in a sidewall of the disc. Each receiving part 906, 907, 908 may be arranged to receive the end of one of the actuator arms so that the actuator arm may be able to apply a force to the disc. Each of receiving parts 906 and 908 may be a substantially smooth surface of the cylindrical sidewall of the disc. The roller bearing on the end of each actuator arm allows movement along the side wall. Receiving part 907 may, for example, constitute an indentation, groove or other structural element in the sidewall of the disc. Alternatively, each receiving part 906, 907, 908 may, for example, constitute an indentation, groove or other structural element in the sidewall of the disc.

A first actuator 901 may be arranged to move the disc in a first linear direction, which may be in an x-y plane. A second actuator 902 may be arranged to move the disc in a second direction that is orthogonal to the first direction and may also be in then x-y plane. A third actuator 903 may, for example, be arranged to apply a rotation to the disc within the x-y plane, which may be an Rz rotation (i.e. movement of the disc about the z-axis).

In the current example, the first actuator 901 may be oriented such that the longitudinal axis of the first actuator 901 is aligned with the first direction as well as with the center of Rz rotation of the disc. Movement of the arm of the first actuator 901 along its longitudinal axis therefore moves the disc only in the first direction and does not substantially rotate the disc. Movement in the first direction by the arm causes relative motion between the receiving parts 908, 907 and 906 and their respective rollers so that the rollers may roll over the surface of the receiving parts 908, 907 and 906.

In the current example, the second actuator 902 may be oriented such that the longitudinal axis of the second actuator 902 is aligned with the second direction as well as the center of Rz rotation of the disc. Movement of the arm of the second actuator 902 along its longitudinal axis therefore moves the disc only in the second direction and does not substantially rotate the disc. Movement in the second direction by the arm causes relative motion between the receiving parts 908, 907 and 906 and their respective rollers so that the rollers may roll over the surface of the receiving parts 908, 907 and 906.

The current example further shows the third actuator 903 which may be oriented such that the longitudinal axis of the third actuator 903 is aligned away from/off the center of Rz rotation of the disc. The receiving part 907 of the longitudinal axis of the arm of the third actuator may be a protrusion from the sidewall of the disc. Movement of the arm of the third actuator 903 along its longitudinal axis therefore rotates the disc. Rotational movement of the disc causes relative rotational motion between the receiving parts 908, 907, 906 and their respective rollers so that the rollers may roll over the surface of the receiving parts 908, 907, 906.

The support position system 801 may also comprise a plurality of planar springs 904, 905, or other force applying devices or resilient members, for biasing the position of the disc against the actuators in the x-y plane of the electron-optical assembly 405.

Each planar spring 904, 905 may, for example, be a linear spring that is arranged to apply a force in the direction of its longitudinal axis. An end of each planar spring 904, 905 may be secured to the base 805 of the electron-optical assembly 405 and an opposite end of each spring 904, 905 secured to or pressing against a sidewall of the disc.

A longitudinal axis of an x-y planar spring 905 may be aligned with the center of Rz rotation of the disc, which as shown in FIG. 5 would be at the center of the opening 806. The x-y planar spring 905 may, for example, be described to be arranged on the opposite side of the disc to the receiving part 908 of the actuator arm of the first actuator 901 and the receiving part 906 of the actuator arm of the second actuator 902. That is, the connection of the x-y planar spring 905 may be arranged on the disc so that x-y planar spring may oppose the forces applied to the disc 901 at the first and second receiving parts 906, 908 by the actuators 901, 902. The x-y planar spring may, for example, be configured to contribute to holding the disc under compression in the first and second directions.

In some embodiments, a longitudinal axis of a rotational planar spring 904 is aligned off/away from the center of Rz rotation of the disc. The rotational planar spring 904 may, for example, be secured to a protrusion 909 in the side of the disc. The rotational planar spring may be arranged so that the rotational planar spring extends when the actuator arm of the third actuator 903 extends to rotate the disc. In some embodiments, the third actuator arm operates on the third receiving surface 907 on the side of the disc. As shown in FIG. 5, the actuator arm extends to cause the disc to rotate in a clockwise direction. The rotational planar spring 904 is connected to the disc so it extends when the disc is rotated in a clockwise direction and compressed when the disc rotates in an anti-clockwise direction. The rotational planar spring 904 is thereby biased against the rotation applied when the actuator arm of the third actuator 903 extends. In some embodiments, the rotational directions may be opposite to those described.

In some embodiments, a single planar spring is used to hold the disc under compression in the first and second directions and also bias against the rotation applied when the actuator arm of the third actuator 903 extends. An end of the planar spring may be secured to the base 805 of the electron-optical assembly 405 and an opposite end of the spring may be secured close to the edge of the central opening in the disc. The spring may be arranged so that it is aligned away from/off the center of Rz rotation of the disc.

The actuators 901, 902, 903 may be part of the electron-optical column 401. The actuators 901, 902, 903 may be separate from the electron-optical assembly 405. The actuator arms may extend through openings in the electron-optical assembly 405 to contact the receiving parts 906, 907, 908. Alternatively, the actuators 901, 902, 903 may be contained entirely within the electron-optical assembly 405 and may be an integral part of the electron-optical assembly 405.

FIG. 6 shows a schematic plan view of the support positioning system 801 of the electron-optical assembly 405. As shown in FIG. 6, in some embodiments, the support positioning system 801 comprises a plurality of piezo-electric actuator arrangements 1205, 1206 that are configured to move a stage of the electron-optical assembly 405. The stage is configured to hold the electron-optical device 404.

As shown in FIG. 6, in some embodiments, the electron-optical assembly 405 comprises piezo-electric arrangements 1205, 1206. The piezo-electric arrangement 1205 may be arranged so that it may move the piezo-electric arrangement 1206 bi-directionally in the x-direction. The piezo-electric arrangement 1206 may be arranged so that it may move the part of the electron-optical assembly 405 that comprises the stage bi-directionally in the y-direction. Embodiments also include the piezo-electric arrangement 1205 alternatively applying movements in the y-direction and piezo-electric arrangement 1206 alternatively applying movements in the x-direction. The electron-optical assembly 405 also comprises one or more piezo-electric arrangements for applying bi-directional rotation to the stage around Rz.

The above described example allows the repositioning of the stage within the electron-optical assembly 405. An electron-optical device 404 may thereby have fine adjustments made to its position as may be required for appropriately aligning the electron-optical device 404 with the other components of the electron-optical column 401. Further details are described in U.S. App Ser. No. 63/037,481 of at least the details relating to actuation of the electron-optical assembly are hereby incorporated by reference.

Figure 7:
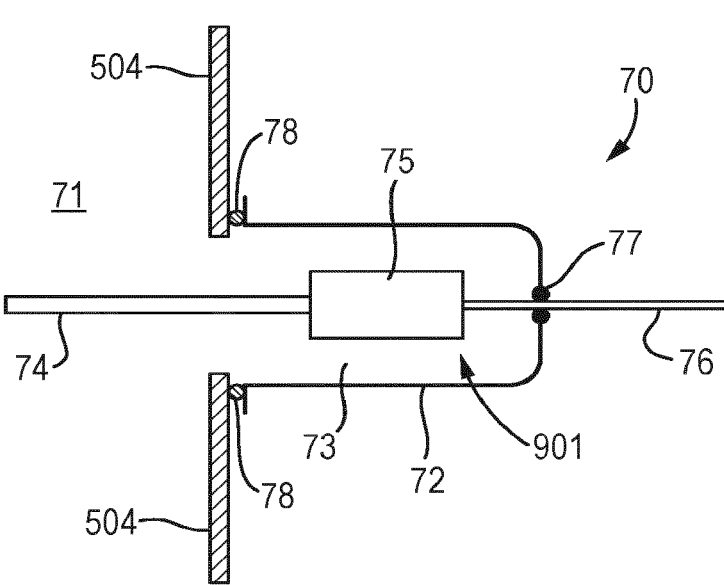
FIGS. 7 to 11 are schematic diagrams of a cross section through actuator arrangements according to some embodiments of the present disclosure.

FIG. 7 is a schematic diagram of a cross section through an actuator arrangement 70 according to some embodiments of the present disclosure. In some embodiments, the electron-optical column 401 is configured to be held at vacuum. The electron-optical column 401 comprises a vacuum chamber configured to contain the vacuum around the electron-optical assembly 405 and defined by a wall 504. As shown in FIG. 7, in some embodiments, the actuator arrangement 70 comprises a wall 504. The wall 504 may be the wall 504 of a vacuum chamber, for example the vacuum chamber of an electron-optical column 401.

The wall 504 defines a cavity 71. The cavity 71 may be kept at a controlled pressure, for example a vacuum pressure. In some embodiments, the cavity 71 is the cavity for at least a part of the electron-optical column, for example in which the electron-optical assembly 405 is required to fit into.

As shown in FIG. 7, in some embodiments, the actuator arrangement 70 comprises a casing 72. The casing 72 protrudes from the wall 504. In the orientation shown in FIG. 7, the cavity 71 defined by wall 504 is to the left of the wall 504. The region to the right of the wall 504 is the environment external to the cavity 71 (e.g. external to the electron-optical column 401). The casing 72 protrudes outwards from the wall 504 to the external environment. The casing 72 defines an interior 73. The casing 72 separates the interior 73 from the external environment. The pressure in the interior 73 can be controlled to be different from the pressure in the external environment.

In some embodiments, the casing 72 functions as a vacuum-separating part. The casing 72 is a rigid body that maintains its shape during use. The casing 72 is configured to withstand the pressure difference between the interior 73 and the external environment.

As shown in FIG. 7, in some embodiments, the interior 73 is in fluid communication with the cavity 71. The interior 73 is at the same or similar pressure as the cavity 71. Leak through the releasable seal 78 and the feedthrough 77 may cause the interior 73 to be at a slightly higher pressure than the cavity 71. Particles are free to flow between the cavity 71 and the interior 73. The cavity 71 and the interior 73 may form a continuous space.

In some embodiments, the casing 72 is made of metal. Metal has a relatively low outgassing rate, thereby keeping low the possibility of contaminating the interior 73 or the cavity 71. However, the material used for the casing 72 is not limited to metal. For example, in some embodiments, the casing 72 is made of a ceramic or a plastic or a glass.

As shown in FIG. 7, in some embodiments, the actuator arrangement 70 comprises an actuator 901. In some embodiments, the actuator 901 is configured to move an element for actuating the electron optical assembly 405. The element may be the disc of the support positioning system 801 of the electron-optical assembly 405, for example, as depicted in FIG. 5. However, the actuator 901 can be used for actuating other components within the cavity 71.

As shown in FIG. 7, in some embodiments, the actuator 901 comprises a force imparter 74. The force imparter 74 is configured to impart force on a component in the cavity 71. In some embodiments, the force imparter 74 is configured to impart a force on an electron-optical component in an electron-optical column 401. In some embodiments, the force imparter 74 is rigid. For example, the force imparter 74 may comprise a rigid rod. As shown in FIG. 7, in some embodiments, the force imparter 74 extends into the cavity 71. The force imparter 74 may extend towards the electron optical assembly 405.

In some embodiments, the actuator 901 is configured to actuate the support positioning system 801 in one or more of the x-direction, the y-direction and rotation about the z-axis. In some embodiments, the actuator 901 is arranged to actuate the support positioning system 801 in a first linear direction, which may be in an x-y plane. In some embodiments, the actuator 901 is arranged to actuate the support positioning system 801 in a second direction that is orthogonal to the first direction and may also be in the x-y plane. In some embodiments, the actuator 901 is arranged to apply a rotation to the support positioning system 801 within the x-y plane, which may be an Rz rotation (i.e. movement of the support positioning system 801 about the z-axis).

As shown in FIG. 7, the casing 72 is attached to the wall 504 around an opening that allows the cavity 71 to fluidly communicate with the interior 73 of the casing 72. In some embodiments, the force imparter 74 is configured to extend through the opening from the interior 73 into the cavity 71.

As depicted in FIG. 7, in some embodiments, the actuator 901 comprises an actuation mechanism 75. The actuation mechanism 75 is configured to drive the force imparter 74. The actuation mechanism 75 is configured to or impart a force, impulse, or transfer kinetic energy, to the force imparter 74 so as to move the force imparter 74. The type of actuation mechanism 75 depends on the type of actuator 901 used as will be described in more detail below.

As shown in FIG. 7, in some embodiments, at least part of the actuation mechanism 75 is within the interior 73 of the casing 72. The actuation mechanism 75 is in fluid communication with the cavity 71. As shown in FIG. 7, the actuation mechanism 75 is within the interior 73 of the casing 72 being in fluid communication with the cavity 71. The actuation mechanism 75 is subjected to the same pressure as the pressure in the cavity 71. The opening in the wall 504 allows fluid communication between the cavity 71 and the region immediately surrounding the actuation mechanism 75. As shown in FIG. 7, in some embodiments, substantially all of the actuation mechanism 75 is within the interior 73 of the casing 72. The side of the actuation mechanism 75 facing away from the cavity 71 is subjected to the same pressure as the pressure within the cavity 71.

Figure 8:
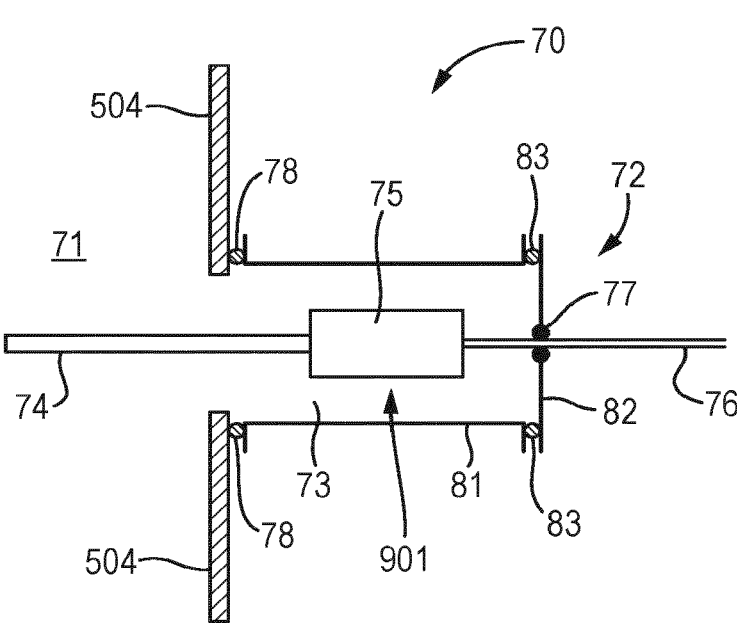

As shown in FIG. 7, in some embodiments, the actuation mechanism 75 is sealed off from the external environment by the casing 72. In some embodiments, the actuator arrangement 70 comprises a control element 76. The control element 76 is configured to control the actuation mechanism 75. The type of control element used may depend on the type of actuator 901 used. As shown in FIGS. 7 and 8, the feedthrough interface comprises the feedthrough 77 through which the control element 76 extends.

The feedthrough 77 is configured to maintain the separation between the interior 73 of the casing 72 and the external environment. This allows the interior 73 to be kept at a different pressure from the external environment. The control element 76 allows the actuation mechanism 75 to be controlled without requiring the actuation mechanism 75 to be in fluid communication with the external environment. In some embodiments, the control element 76 is a tube or a wire, for example.

In some embodiments, the feedthrough 77 comprises a seal. The seal may comprise a resilient O-ring or a copper gasket, for example. Other types of seal known to the skilled person may be used. By providing that the control element 76 extends through the casing 72 via the feedthrough 77, effectively the whole casing 72 functions as a feedthrough element. The end portion of the casing 72 facing away from cavity 71 functions as a feedthrough interface. The section of the casing 72 surrounding the actuation mechanism 75 functions as a housing configured to surround at least part of the actuation mechanism 75. As shown in FIG. 7 in some embodiments, the housing and the feedthrough interface are formed integrally together.

As shown in FIG. 7, in some embodiments, the side of the actuation mechanism 75 that faces the cavity 71 is within the interior 73 of the casing 72. The actuation mechanism 75 is distanced from the opening in the wall 504 that defines the cavity 71. The actuation mechanism 75 is external to the cavity 71.

In some embodiments, the cavity 71 can be controlled to be at vacuum pressure. In some embodiments, the cavity 71 can be vented and controlled to be at a higher pressure, for example at a pressure equal to the pressure in the external environment or an intermediate pressure (i.e. between the vacuum pressure and the pressure in the external environment). When the cavity 71 is at vacuum pressure, the forces in the actuator arrangement 70 are balanced. Both the side of the actuation mechanism 75 facing the cavity 71 and the side of the actuation mechanism 75 facing away from the cavity 71 are subjected to the same pressure. When the cavity 71 is vented such that its pressure is increased, the forces in the actuator arrangement 70 remain balanced. Both sides of the actuation mechanism 75 remain subjected to the same pressure. In some embodiments, the force imparted by the actuator 901 remains constant regardless of the pressure of the cavity 71 and the interior 73 of the casing 72. According to some embodiments of the present disclosure, the possibility of undesirable actuation changes during venting can be reduced.

It is not necessary for the actuation mechanism 725 to be particularly powerful in order to prevent changes in actuation during venting. According to some embodiments of the present disclosure, the freedom of choice of actuator 901 can be increased. In general, a more powerful actuation mechanism 75 may be physically bigger than a less powerful actuation mechanism 75. According to some embodiments of the present disclosure, the possibility of the size of the actuation mechanism 75 required can be reduced.

Some known actuator arrangements require a flexible bellow that changes shape during the use of the actuator. In such an arrangement the bellow may form part of the surface defining the vacuum in cavity 71. When the cavity is vented, the pressure difference within the cavity and the exterior changes, leading to a change in the force applied to the bellow which would deform in response. As shown in FIG. 7, in some embodiments, the actuator arrangement 70 does not require any such flexible bellow. According to some embodiments of the present disclosure, the mechanical complexity of the design of the actuator arrangement can be reduced.

As shown in FIG. 7, in some embodiments, the casing 72 is formed by a unitary body of material. In some embodiments, the casing 72 is shaped as a bell jar. However, it is not essential for the casing 72 to be made of a single piece of material. In some embodiment as will be described in further detail below, the casing 72 may comprise a plurality of components that are sealable together.

In order to control the actuator 901 from a position in the external environment, it is necessary to cross the vacuum-air interface at some point. As shown in FIG. 7, in some embodiments, the vacuum-air interface is crossed by the control element 76. The actuation mechanism 75 and the force imparter 74 are on the vacuum side of the vacuum-air interface. In some embodiments, the control element 76 comprises an electrical wire. This allows the vacuum-air interface to be crossed electrically rather than mechanically. Crossing the vacuum-air interface electrically is more simple and reliable then crossing the vacuum-air interface mechanically.

As shown in FIG. 7, the actuation mechanism 75 is outside of the cavity 71. At least some embodiments can enable retrofitting of the actuator arrangement 70 to an existing piece of apparatus, such as an electron-optical column 401. At least some embodiments can make it easier to access the actuation mechanism 75 and the force imparter 74 for servicing and replacement, for example.

As shown in FIG. 7, in some embodiments, the casing 72 is sealed to the wall 504 by a releasable seal 78. The releasable seal 78 may comprise a resilient O-ring or a copper gasket, for example. Other types of seal known to the skilled person may be used. By providing the releasable seal 78, the actuator arrangement 70 can be more easily replaced or serviced.

FIG. 8 is a schematic diagram of an actuator arrangement 70 according to some embodiments. In the actuator arrangement 70 shown in FIG. 8, the casing 72 is in two pieces. (A variant may be made of more pieces, but the same principles would apply as described in reference to the example shown and described). As shown in FIG. 8, in some embodiments, the casing 72 comprises a housing 81. The housing 81 is configured to surround at least part of the actuation mechanism 75. In some embodiments, the housing 81 is shaped as a cylinder. In some embodiments, the housing 81 is shaped as a square prism, for example. Other shapes known to the skilled person are possible. The housing 81 is configured to enclose the actuation mechanism 75.

As shown in FIG. 8, in some embodiments, the casing 72 comprises a feedthrough interface 82. The control element 76 extends through the feedthrough interface 82. In the arrangement shown in FIG. 7, the casing 72 comprises a housing and a feedthrough interface formed as a unitary component. As shown in FIG. 8, in some embodiments, the feedthrough interface 82 is sealable to the housing 81. As shown in FIG. 8, a seal 83 is provided to seal the housing 81 to the feedthrough interface 82. In some embodiments, the seal 83 comprises a resilient O-ring or a copper gasket, for example. Other types of seal known to the skilled person can alternatively be used.

By providing that the casing 72 comprises the housing 81 and the feedthrough interface 82 as separate components, the functions of the casing 72 can be separated. The housing 81 can perform the function of physically extending around the actuation mechanism 75. The housing 81 provides the space to allow the actuation mechanism 75 to be positioned outside of the cavity 71 whilst being sealed off from the external environment. The feedthrough interface 82 is configured to allow the actuation mechanism 75 to be connected to an external controller via the control element 76. The housing 81 and the feedthrough interface 82 can be specifically designed for these respective functions. Features of the embodiments shown in FIGS. 7 to 11 may be applied to any of the other embodiments unless described otherwise.

In some embodiments, the feedthrough interface 82 comprises connectors for connecting two individual control elements on either side of the feedthrough interface 82. In some embodiments, the feedthrough interface 82 is an off-the-shelf component that is not required to be specifically designed for the actuator arrangement 70.

Figure 9:
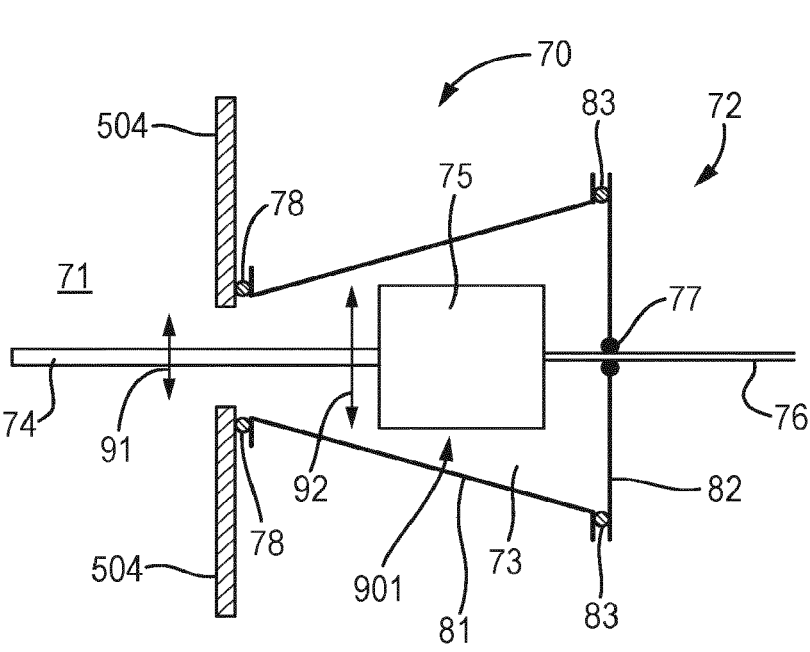

FIG. 9 is a schematic diagram of an actuator arrangement 70 according to some embodiments. As shown in FIG. 9, in some embodiments, the casing 72 comprises an opening having a dimension 91 for providing fluid communication with the cavity 71. The releasable seal 78 extends around the opening of the casing 72. The releasable seal 78 may be resealable to the casing 72. As shown in FIG. 9, in some embodiments, the actuation mechanism 75 is too big to fit through the opening of the casing 72. At least some embodiments can increase the range of choice of the actuation mechanism 75. The dimension 91 of the opening s smaller than the dimension 92 of the actuation mechanism 75. As shown in FIG. 9, in some embodiments, the housing 82 has a greater cross sectional area around the actuation mechanism 75 than around the opening towards the cavity 71. In some embodiments, the housing 81 has a tapered shape. By providing that the casing 72 comes in two pieces, the actuation mechanism 75 can be positioned within the housing 81 before the housing 81 is sealed to the feedthrough interface 82.

The opening is dimensioned to be smaller than a dimension 92 of the actuation mechanism 75. In some embodiments, the opening is dimensioned to be smaller than the smallest dimension 92 of the actuation mechanism 75.

Figure 10:
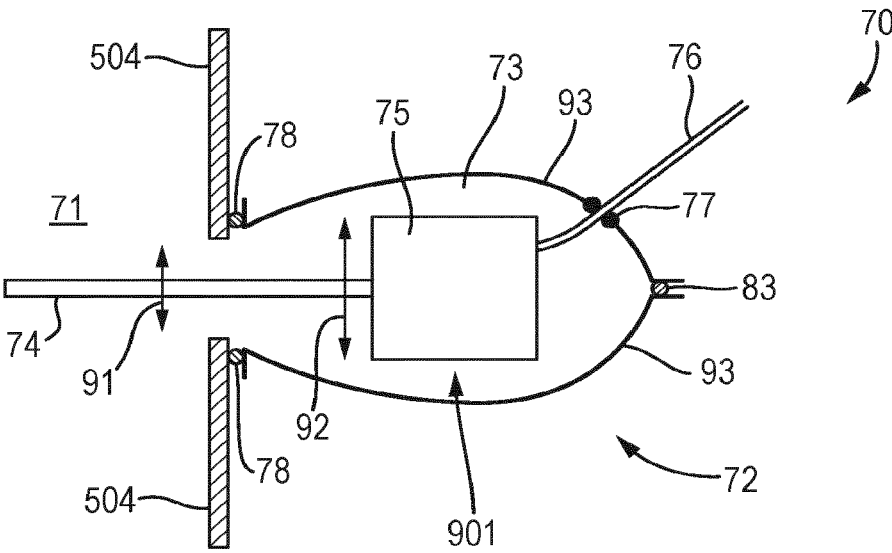

FIG. 10 is a schematic diagram of an actuator arrangement 70 according to some embodiments. A shown in FIG. 10, in some embodiments, the casing 72 comprises at least one shell-shaped piece 93. In the arrangement shown in FIG. 10, the casing 72 comprises two shell-shaped pieces 93. The shell-shaped pieces 93 are sealed together by a seal 83. The seal 83 extends around the edge of the shell-shaped pieces 93 from the wall 504 to the edge of the casing 72 facing away from the cavity 71 and back to the wall 504. The control element 76 extends through one of the shell-shaped pieces 93. By providing the shell-shaped pieces 93, a larger actuation mechanism 75 can be provided than would not fit through the opening with the cavity 71. The actuation mechanism 75 can be positioned between the shell-shaped pieces 93 during manufacture before they are sealed together. The shell shaped pieces may be fitted to the wall 504 in an open position. Joining edges of each shell shaped piece may be further apart away from the wall 504 than close to the wall 504. The actuation mechanism 75 may be fitted with the shell shaped pieces in the open position. One or both of the shell shaped pieces may be moved to a closed position. In the closed position, the joining edges of the shell shaped pieces adjoining each other so that the joining edges may be sealed together. Although the casing 72 features two shell shaped pieces, there may be any number of shell shaped pieces so long as they have an open position at which the actuator mechanism may be fitted, and a closed position enabling the sealing of the shell shaped pieces together. Although the shell shaped pieces 93 are shown to have curved surfaces, in some embodiments, the shell shaped pieces may be formed to from a casing of any shape conceivable to a person skilled in the art, such as the shapes of any of the other embodiments As shown in FIGS. 9 and 10, in some embodiments, the housing of the casing 72 has a cross-sectional area that increases away from the wall 504. This allows the actuation mechanism 75 to be larger than the dimension 91 of the opening that provides no communication with the cavity 71. As shown in FIGS. 7 and 8, in some embodiments, the housing 81 of the casing 72 has a constant cross-sectional area where the housing 71 surrounds the actuation mechanism 75.

In the example shown in FIG. 10, the upper of the shell-shaped pieces 93 functions as the feedthrough interface. As shown in FIG. 10, in some embodiments, the feedthrough interface and the housing are sealable to each other.

Figure 11:
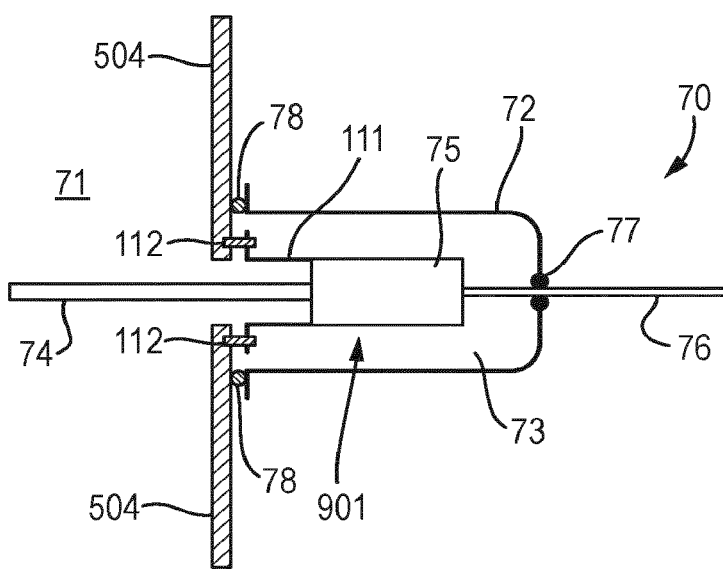

FIG. 11 is a schematic diagram of an actuator arrangement 70 according to some embodiments. As shown in FIG. 11, in some embodiments, the actuation mechanism 75 is fixed to the wall 504. The actuation mechanism 75 is unconnected to the casing 72. That is, the actuation mechanism is connected separately to the wall 504 from the casing 72. For example, as shown in FIG. 11 in some embodiments, the actuator arrangement 70 comprises a bracket 111. The bracket 111 is fixed relative to the actuation mechanism 75. The bracket 111 is fixed to the wall 504 by at least one fixing element 112. A fixing element 112 may be, for example, a screw. By providing that the actuation mechanism 75 is separate from the casing 72, vibrations caused by the actuation mechanism 75 are less likely to stress the seal 78 and the feedthrough 77. At least some embodiments can improve the reliability of the seal from the external environment.

However, it is not essential for the actuation mechanism 75 to be fixed to the wall 504 and unconnected to the casing 72. In some embodiments, the actuation mechanism 75 is connected to the casing 72. The actuation mechanism 75 is not required to be fixed to the wall 504. At least some embodiments can make it easier to remove and replace the casing 72 and actuator 901 from the wall 504.

The example shown in FIG. 11 may be combined with the embodiments shown in FIGS. 7 to 10. For example, any of the embodiments shown in FIGS. 7 to 10 may have the actuator mechanism 75 connected to the wall 504 separately from the casing 72. As shown in FIG. 11 the actuation mechanism 75 is separately fixed to the wall 504.

In some embodiments, the actuation mechanism 75 is selected from a group consisting of a piezoelectric actuation mechanism, a hydraulic actuation mechanism, a pneumatic actuation mechanism, an electromechanical actuation mechanism, an electrohydraulic actuation mechanism, a twisted and coiled polymer actuation mechanism, a thermal actuation mechanism and a mechanical actuation mechanism. In some embodiments, the actuation mechanism comprises a cylindrical tube along which a piston can slide. Alternatively, the actuation mechanism 75 may comprise a motor that converts electrical energy into mechanical torque. The actuation mechanism 75 may comprise a hydraulic accumulator configured to transmit actuation force. Alternatively the actuation mechanism 75 may comprise a coiled polymer configured to be actuated by electric power. In some embodiments, the actuation mechanism 75 may comprise a gearbox for mechanical actuation.

Figure 12:
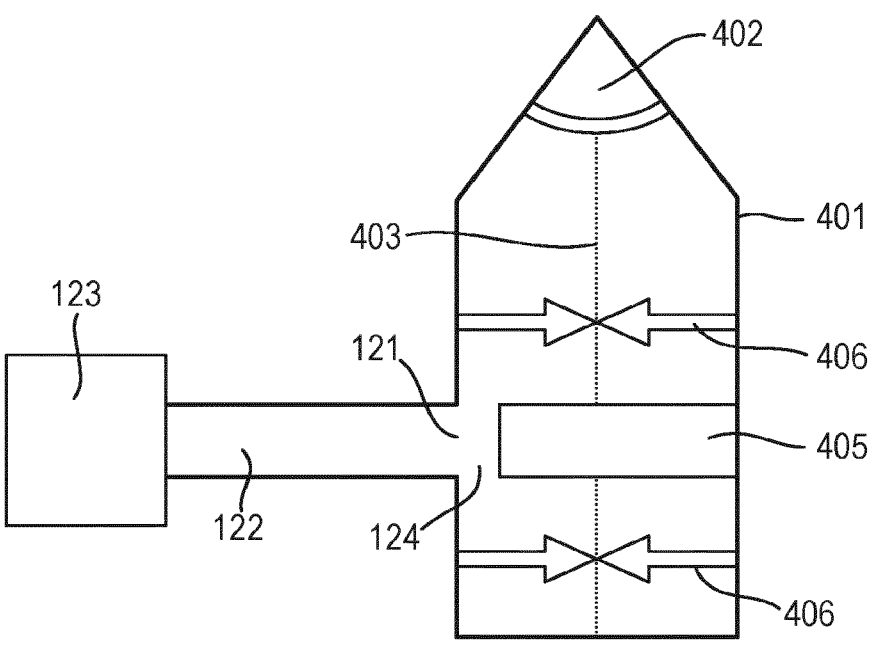
FIG. 12 is a schematic diagram of a cross section through an electron-optical column according to some embodiments of the present disclosure.

FIG. 12 is a schematic diagram of part of an electron-optical column 401 according to some embodiments. FIG. 12 is similar to the arrangement shown in FIG. 4; common features have the same references. As shown in FIG. 12, in some embodiments, the electron-optical column 401 comprises a conduit opening 121. The conduit opening 121 is defined in the wall 504 and is configured to provide fluid connection to a vacuum source 123. The conduit opening 121 is in fluid communication with the vacuum source 123 by a conduit 122.

As shown in FIG. 12, in some embodiments, a position of the conduit opening 121 in an axial direction of the electron-optical column 401 at least partially overlaps a position of the electron-optical assembly 405 in the axial direction. In the orientation shown in FIG. 12 the conduit opening 121 overlaps the electron-optical assembly 405 in the up-and-down direction, for example in the direction of the beam path or vertically.

There is limited space in the electron-optical column 401. At least one electron-optical assembly 405 within the electron-optical column 401 at least partially occludes the conduit opening 121. Occlusion of the conduit opening 121 reduces the effect of the vacuum source 123. It may take longer to change the pressure within the vacuum chamber of the electron-optical column 401 or to reach its target pressure.

Figures 13, 14:
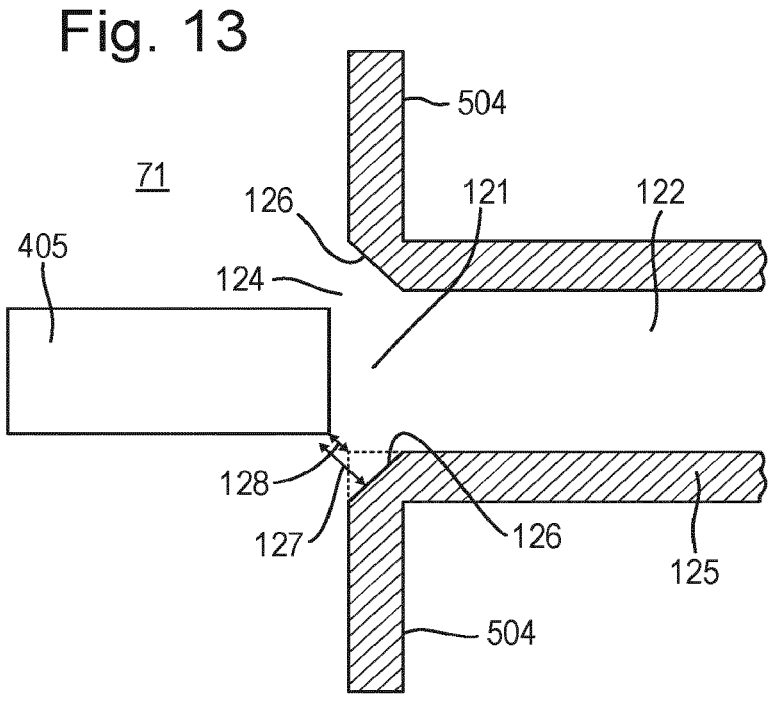
FIG. 13 is a schematic diagram of a cross section through an electron-optical column according to some embodiments of the present disclosure.
FIG. 14 is a schematic diagram of a cross section through an electron-optical column according to some embodiments of the present disclosure.

FIG. 13 is a close-up view of the electron-optical assembly 405 in the region of the conduit opening 121. As shown in FIG. 13 in some embodiments, the electron-optical assembly 405 is arranged so as to only partially occlude the conduit opening 121 such that an area 124 sufficient for the vacuum source 123 to be applied throughout the vacuum chamber is open to the vacuum source 123. Different ways of providing a sufficiently large area 124 are described in more detail below.

As shown in FIG. 13, in some embodiments, the conduit opening 121 is chamfered so as to increase the area 124 of the conduit opening 121 open to the vacuum source 123. As shown in FIG. 13, in some embodiments, both the upper and lower edges of the conduit opening 121 comprise chamfers 126. In some embodiments, the chamfer 126 is applied only partially around the circumference of the conduit opening 121. Although not shown in FIG. 13, in some embodiments, the electron-optical assembly 405 is chamfered so as to increase the area 124 of the conduit opening 121 open to the vacuum source 123. For example, in some embodiments, a corner of the electron-optical assembly 405 facing the conduit opening 121 comprises a chamfer.

FIG. 13 illustrates the area 124 of the conduit opening 121 open to the vacuum source 123. As shown in FIG. 13, the smallest distance between the electron-optical assembly 405 and the conduit wall 125 is increased from a smaller distance 128 to a greater distance 127 by providing the chamfer 126 at the conduit opening 121. The smaller distance represents the clearance that the area 124 would have if the chamfer 126 were not provided. The dotted line shows where the wall 504 would extend to if the chamfer 126 were not provided. The larger distance 128 represents the clearance of the area 124 when the chafer 126 is provided. At least some embodiments can make it faster to change the pressure within the cavity 71 of the electron-optical column 401.

As shown in FIG. 14, in some embodiments, a cross-section of the vacuum chamber is larger around the electron-optical assembly 405 then at a position axially distanced from the electron-optical assembly 405. As shown in FIG. 14, in some embodiments, the width of a vacuum chamber is extended in a region that overlaps with the axial position of the electron-optical assembly 405. The extra width allows the vacuum source 123 to be applied more quickly throughout the vacuum chamber.

As shown in FIG. 14, in some embodiments, the surface of the wall 504 of the electron-optical column 401 has one or more grooves 141 defined in it. The groove 141 is configured to distribute an under pressure from the vacuum source 123 through the vacuum chamber of the electron-optical column 401. By providing the groove 141, an extra channel 142 is formed through which the under pressure can be distributed. In some embodiments, the groove may be formed in a surface, which may generally be orthogonal to the beam path, across the electron-optical column 401. The surface across the electron-optical column may form part of the up-beam lock 406 or down-beam lock 406.

Although not depicted in FIG. 14, in some embodiments, the surface of the electron-optical assembly 405 has one or more grooves defined in it. The groove is configured to distribute an under pressure from the vacuum source 123 through the vacuum chamber. The groove may be formed in an external, and/or interior surface of the electron-optical assembly 405.

Figure 15:
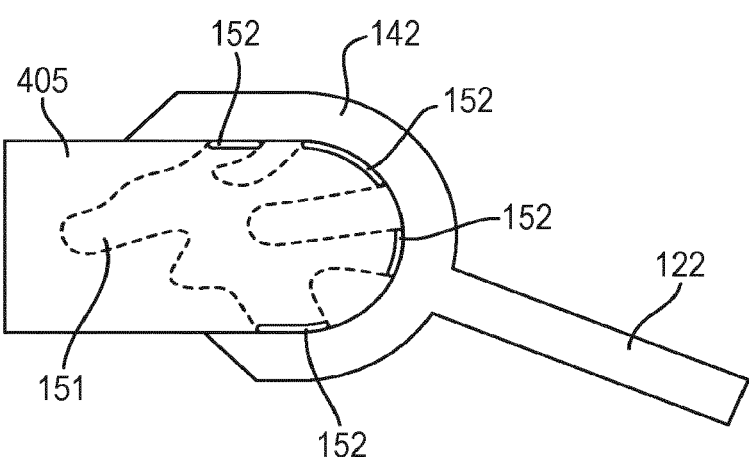
FIG. 15 is a schematic diagram of a cross section through an electron-optical column according to some embodiments of the present disclosure.

FIG. 15 is a schematic view of the cross-section of the electron-optical column 401 according to some embodiments. The electron-optical assembly 405 may defined by a shell or panel. In some embodiments, the surface of a panel of the electron-optical assembly 405 has a feature defined in it, the feature being configured to distribute an under pressure of a vacuum chamber. The feature may be grooves which may be distributed over an exterior or interior surface of the electron-optical assembly 405. The grooves may take the form of a network, as shown by network 151.

As shown in FIG. 15, in some embodiments, one or more openings 152 are defined in the electron-optical assembly 405. The openings 152 are at the external surface of the electron-optical assembly 405. The openings 152 may be through the shell of the electron-optical assembly 405. As shown in FIG. 15, in some embodiments, two or more of the openings 152 are connected to each other by an open network 151 within the electron-optical assembly 105. The opening network 151 may be a network of grooves defined in the surface of a panel. The two or more openings 152 may be in fluid communication with each other through the open area within the electron-optical assembly 405.

As shown in FIG. 15, in some embodiments, the conduit 122 is in fluid communication with the openings 152. In some embodiments, the conduit opening 121 is in fluid communication with the openings 152 via one or more channels 142 extending around the electron-optical assembly 405. The channels 142 may be formed by grooves 141 in the surface of the wall 504 of the electron-optical column 401. The grooves may form a network, like that defined in the panels, in an interior surface of the wall 504 or of the up beam lock 406 and down-beam lock 406.

Figure 16:
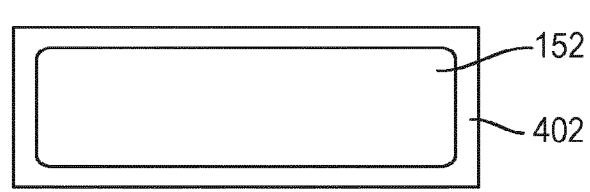
FIGS. 16 to 18 are schematic diagrams of part of an electron-optical assembly according to some embodiments of the present disclosure.
Figure 17:
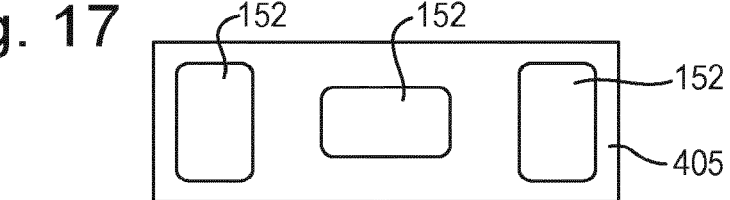
Figure 18:
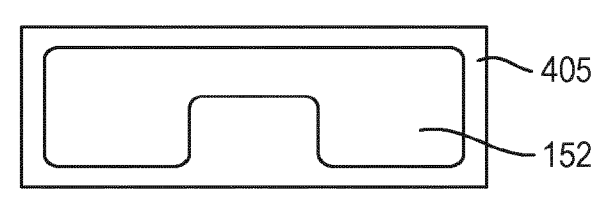

In some embodiments, the electron-optical assembly 405 comprises a shell partially defining the electron-assembly 405. The shell is a surrounding wall of the electron-optical assembly 405. The one or more openings 152 define passages through the shell into the electron-optical assembly 405. Embodiments of opening 152 are shown in a portion of the shell of the electron-optical assembly in FIGS. 16, 17 and 18. The example shown in FIG. 16 shows that an opening 152 is defined in most of a surface of the shell; the opening 152 may be rectangular. The example in FIG. 17 shows a surface of the shell in which three openings 162 are defined; each opening is shown rectangular. FIG. 18 shows an example in which the opening 152 has a bespoke shape, which may be described as a C shape, or two conjoined rectangles. The openings 152 may be of any number and any shape conceivable by a person skilled in the art. Such openings 152 may be the same as opening 152 described and shown in respect to FIG. 15.

As described above, in some embodiments, the electron-optical assembly 405 is replaceable. For example in some embodiments, the electron-optical assembly 405 is field replaceable.

In some embodiments, the electron-optical assembly 405 is the electron-optical assembly 405 described above as a module. In some embodiments, it may be a stage to support which the electron optical device 404 for example, if a module is absent. References in the description to the electron-optical assembly 405 may be applied to the features where a stage is present, for example without other features of the module enabling replaceability or field replaceability. In some embodiments, the electron-optical assembly 405 is a different part of the electron-optical column 401. The different part of the electron-optical column 401 may be, in a non-limited list, an electron-optical component such as a condenser lens arrangement, an objective lens assembly, a Wien filter arrangement, a detector or an element of a secondary column for an electron detector.

The electron-optical column 401 may specifically be a multi-beam electron-optical column 401. The electron-optical column 401 may be part of an electron beam tool 40, 300 as described above with reference to FIGS. 1, 2 and 3.

The electron beam tool 40, 300 may be a component of an inspection (or metro-inspection) tool or part of an e-beam lithography tool. The multi-beam charged particle apparatus may be used in a number of different applications that include electron microscopy in general, not just SEM, and lithography.

Throughout embodiments a charged particle axis is described. This axis describes the path of charged particles through and output from the source 201, 301. The sub-beams of an output multi-beam may all be substantially parallel to the charged particle optical axis 403. The charged particle optical axis 204, 304 may be the same as, or different from, a mechanical axis of the illumination apparatus. In an arrangement in which the charged particle beam move away from the electron-optical axis for part of the electron-optical column, for example when the beam is temporarily deflected away from the axis, reference to axis may refer to the beam axis for such portion.

While the embodiments of the present disclosure have been described in connection with various examples, other embodiments will be apparent to those skilled in the art from consideration of the specification and practice of the technology disclosed herein. It is intended that the specification and examples be considered as exemplary only, with a true scope and spirit of the invention being indicated by the following claims.

The descriptions above are intended to be illustrative, not limiting. Thus, it will be apparent to one skilled in the art that modifications may be made as described without departing from the scope of the claims and clauses set out below.

There are provided the following clauses:

Clause 1: An actuator arrangement comprising: a wall defining a cavity; a casing protruding from the wall and defining an interior in fluid communication with the cavity; an actuator comprising: a force imparter configured to impart force on a component in the cavity; and an actuation mechanism configured to drive the force imparter, wherein at least part of the actuation mechanism is within said interior of the casing being in fluid communication with the cavity; and a control element configured to control the actuation mechanism, wherein the control element extends through the casing via a feedthrough.

Clause 2: The actuator arrangement of clause 1, wherein the casing is sealed to the wall by a releasable seal.

Clause 3: The actuator arrangement of any preceding clause, wherein the casing comprises: a housing configured to surround at least part of the actuation mechanism; and a feedthrough interface comprising the feedthrough through which the control element extends.

Clause 4: The actuator arrangement of clause 3, wherein the housing has a cross sectional area that increases away from the wall.

Clause 5: The actuator arrangement of any of clauses 3 or 4, wherein the housing has a constant cross sectional area where the housing surrounds the actuation mechanism.

Clause 6: The actuator arrangement of any of clauses 3 to 5, wherein the feedthrough interface and the housing are sealable to each other.

Clause 7: The actuator arrangement of any preceding clause, wherein the casing comprises an opening for fluid communication with the cavity and optionally the opening is dimensioned to be smaller than a dimension, preferably the smallest dimension, of the actuation mechanism.

Clause 8: The actuator arrangement of any preceding clause, wherein the actuation mechanism is separately fixed to the wall from the casing.

Clause 9: The actuator arrangement of any preceding clause, wherein the actuation mechanism is selected from a group consisting of a piezoelectric actuation mechanism, a hydraulic actuation mechanism, a pneumatic actuation mechanism, an electromechanical actuation mechanism, an electrohydraulic actuation mechanism, a twisted and coiled polymer actuation mechanism, a thermal actuation mechanism and a mechanical actuation mechanism.

Clause 10: A vacuum chamber comprising the actuator arrangement of any preceding clause, wherein the wall defines the cavity of the vacuum chamber.

Clause 11: An electron-optical column configured to be held at vacuum comprising: the vacuum chamber of clause 10 configured to contain the vacuum.

Clause 12: The electron-optical column of clause 11, comprising: an electron-optical element configured to manipulate a path of a beam of charged particles through the column; and an actuator assembly configured to actuate the electron-optical element or a stage supporting the electron-optical element for aligning the electron-optical element with respect to a source and/or other electron-optical elements in the column, wherein the actuator assembly comprises the actuator and the force imparter is configured to impart force on the electron-optical element or the stage supporting the electron-optical element.

Clause 13: The electron-optical column of clause 12, wherein the electron-optical element is supported on a stage and is optionally part of a replaceable module, preferably a field replaceable module.

Clause 14: The electron-optical column of clause 12 or 13, wherein the electron-optical element is part of a MEMS module.

Clause 15: An electron-optical column configured to be held at vacuum comprising: an electron-optical assembly; a vacuum chamber configured to contain the vacuum around the electron-optical assembly and defined by a wall; and a conduit opening defined in the wall configured to provide fluid connection to a vacuum source, wherein a position of the conduit opening in an axial direction of the electron-optical column at least partially overlaps a position of the electron-optical assembly in the axial direction, and wherein the electron-optical assembly is arranged so as to only partially occlude the conduit opening such that an area sufficient for the vacuum source to be applied throughout the vacuum chamber is open to the vacuum source.

Clause 16: The electron-optical column of clause 15, wherein a cross-sectional area of the vacuum chamber is larger around the electron-optical assembly than at a position axially distanced from the electron-optical assembly.

Clause 17: The electron-optical column of clause 15 or 16, wherein at least one of the conduit opening and the electron-optical assembly is chamfered so as to increase the area of the conduit opening open to the vacuum source Clause 18: The electron-optical column of any of clauses 15 to 17, wherein in the surface of one or both of the electron-optical assembly and the wall is defined one or more grooves configured to distribute an under pressure from the vacuum source through the vacuum chamber.

Clause 19: The electron-optical column of any of clauses 15 to 18, wherein the conduit opening is in fluid connection with openings defined in the electron-optical assembly.

Clause 20: The electron-optical column of clause 19, wherein the electron-optical assembly comprises a shell partially defining the electron-optical assembly, and one or more openings define passages through the shell into the electron-optical assembly.

Clause 21: The electron-optical column of any of clauses 15 to 20, wherein the electron-optical assembly comprises an electron-optical element configured to manipulate a path of a beam of charged particles through the electron-optical column.

Clause 22: The electron-optical column of any of clauses 15 to 21, wherein the electron-optical assembly is part of a replaceable module, preferably a field replaceable module.

Clause 23: The electron-optical column of clause 21 or 22, wherein the electron-optical element is part of a MEMS module.

Clause 24: The electron-optical column of any of clauses 15 to 23, wherein the vacuum chamber is the vacuum chamber of claim 10.

Clause 25: A replaceable electron-optical assembly configured for use in a vacuum chamber of an electron-optical column, the removeable electron-optical assembly comprising an electron-optical element configured to manipulate a path of a beam of charged particles through the electron-optical column, wherein in a surface of the removeable electron-optical assembly is defined a feature configured to distribute an under pressure through the vacuum chamber.

Clause 26: The removeable electron-optical assembly of clause 25 configured to be a field replaceable module.

Clause 27: The removeable electron-optical assembly of clause 25 or 26, wherein the feature is at least one of: an opening fluidly connecting a cavity in the removeable electron-optical assembly; a shaped surface such as a chamfer; and a groove over the surface Clause 28: A method of manufacturing an actuator arrangement, the method comprising: providing a wall defining a cavity; providing an actuator comprising: a force imparter configured to impart force on a component in the cavity; and an actuation mechanism configured to drive the force imparter; extending a control element configured to control the actuation mechanism through the casing via a feedthrough; disposing the actuation mechanism within an interior of a casing; connecting the actuation mechanism to the control element; and sealing the casing to the wall such that the casing protrudes from the wall and the actuation mechanism is in fluid communication with the cavity.

Clause 29: A method of replacing an actuation mechanism of an actuator arrangement, the method comprising: providing the actuator arrangement of clause 2; releasing the seal between the wall and the casing; replacing the actuation mechanism; and sealing the casing to the wall.

Clause 30: A method of manufacturing an electron-optical column configured to be held at vacuum comprising: providing an electron-optical assembly; defining a vacuum chamber by a wall to contain the vacuum around the electron-optical assembly; and defining a conduit opening in the wall configured to provide fluid connection to a vacuum source, at least partially overlapping a position of the conduit opening in an axial direction of the electron-optical column with a position of the electron-optical assembly in the axial direction, and arranging the electron-optical assembly so as to only partially occlude the conduit opening such that an area sufficient for the vacuum source to be applied throughout the vacuum chamber is open to the vacuum source.

The invention claimed is:

1. An actuator arrangement comprising:
a wall defining a cavity;
a casing protruding from the wall and defining an interior in fluid communication with the cavity;
an actuator comprising:
    a force imparter configured to impart force on a component in the cavity; and
    an actuation mechanism configured to drive the force imparter, wherein at least part of the actuation mechanism is within said interior of the casing being in fluid communication with the cavity; and
a control element configured to control the actuation mechanism, wherein the control element extends through the casing via a feedthrough.

2. The actuator arrangement of claim 1, wherein the casing is sealed to the wall by a releasable seal.

3. The actuator arrangement of claim 1, wherein the casing comprises:
a housing configured to surround at least part of the actuation mechanism; and
a feedthrough interface comprising the feedthrough through which the control element extends.

4. The actuator arrangement of claim 3, wherein the housing has a cross sectional area that increases away from the wall.

5. The actuator arrangement of claim 3, wherein the housing has a constant cross sectional area where the housing surrounds the actuation mechanism.

6. The actuator arrangement of claim 3, wherein the feedthrough interface and the housing are sealable to each other.

7. The actuator arrangement of claim 1, wherein the casing comprises an opening for fluid communication with the cavity.

8. The actuator arrangement of claim 1, wherein the actuation mechanism is separately fixed to the wall from the casing.

9. The actuator arrangement of claim 1, wherein the actuation mechanism is selected from a group consisting of a piezoelectric actuation mechanism, a hydraulic actuation mechanism, a pneumatic actuation mechanism, an electro-mechanical actuation mechanism, an electrohydraulic actuation mechanism, a twisted and coiled polymer actuation mechanism, a thermal actuation mechanism and a mechanical actuation mechanism.

10. The actuator arrangement of claim 1, wherein the wall is of a vacuum chamber configured to define a cavity that is configured to contain a vacuum.

11. The actuator arrangement of claim 1, wherein the casing is configured to protrude outwards from the wall to an external environment.

12. A vacuum chamber comprising the actuator arrangement of claim 1, wherein the wall defines the cavity of the vacuum chamber.

13. An electron-optical column configured to be held at vacuum, the electron-optical column comprising:
the vacuum chamber of claim 12 configured to contain the vacuum.

14. The electron-optical column of claim 13, further comprising:
an electron-optical element configured to manipulate a path of a beam of charged particles through the column; and
an actuator assembly configured to actuate the electron-optical element or a stage supporting the electron-optical element for aligning the electron-optical element with respect to a source and/or other electron-optical elements in the column,
wherein the actuator assembly comprises the actuator and the force imparter is configured to impart force on the electron-optical element or the stage supporting the electron-optical element.

15. The electron-optical column of claim 14, wherein the electron-optical element is supported on a stage.

16. The electron-optical column of claim 14, wherein the electron-optical element is part of a MEMS module.

17. A method of manufacturing an actuator arrangement, the method comprising:
providing a wall defining a cavity;
providing an actuator comprising:
    a force imparter configured to impart force on a component in the cavity; and
    an actuation mechanism configured to drive the force imparter;
extending a control element configured to control the actuation mechanism through a casing via a feedthrough;
disposing the actuation mechanism within an interior of the casing;
connecting the actuation mechanism to the control element; and
sealing the casing to the wall such that the casing protrudes from the wall and the interior of the casing is in fluid communication with the cavity.

18. A method of replacing an actuation mechanism of an actuator arrangement comprising a wall defining a cavity, a casing protruding from the wall and defining an interior that is in fluid communication with the cavity, the casing being sealed to the wall by a seal, a force imparter configured to impart force on a component in the cavity, the actuation mechanism configured to drive the force imparter, part of the actuation mechanism being disposed in the interior of the casing, and a control element extending through the casing via a feedthrough and configured to control the actuation mechanism, and the method comprising:
releasing the seal between the wall and the casing;
replacing the actuation mechanism; and
sealing the casing to the wall.

19. An actuator arrangement comprising:
a wall of a vacuum chamber configured to be maintained at a vacuum, the wall configured to define a cavity;
a casing configured protrude outwards from the wall and configured to define an interior in fluid communication with the cavity;
an actuator comprising:
    a force imparter configured to impart force on a component in the cavity; and an actuation mechanism configured to drive the force imparter, wherein at least part of the actuation mechanism is within said interior of the casing being in fluid communication with the cavity; and a control element configured to control the actuation mechanism, wherein the control element extends through the casing via a feedthrough.

20. The actuator arrangement of claim 19, wherein the casing comprises: a housing configured to surround at least part of the actuation mechanism; and a feedthrough interface comprising the feedthrough through which the control element extends.

\* \* \* \* \*